US012757661B2

(12) United States Patent
Yeh

(10) Patent No.: US 12,757,661 B2
(45) Date of Patent: Oct. 6, 2026

(54) SEMICONDUCTOR DEVICE, SEMICONDUCTOR STRUCTURE AND METHOD FOR FABRICATING SEMICONDUCTOR DEVICE AND SEMICONDUCTOR STRUCTURE USING TILTED ETCH PROCESS

(71) Applicant: NANYA TECHNOLOGY CORPORATION, New Taipei (TW)

(72) Inventor: Huan-Yung Yeh, Taoyuan (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 377 days.

(21) Appl. No.: 18/212,298

(22) Filed: Jun. 21, 2023

(65) Prior Publication Data

US 2023/0335408 A1 Oct. 19, 2023

Related U.S. Application Data

(60) Continuation-in-part of application No. 17/572,807, filed on Jan. 11, 2022, now Pat. No. 11,728,174, (Continued)

(51) Int. Cl.
*H10P 50/00* (2026.01)
*H10P 50/28* (2026.01)
(Continued)

(52) U.S. Cl.
CPC .......... *H10P 50/696* (2026.01); *H10P 50/283* (2026.01); *H10P 50/695* (2026.01);
(Continued)

(58) Field of Classification Search
CPC ............. H01L 21/3088; H01L 21/0388; H01L 21/3086; H01L 21/31144; H01L 21/32139;
(Continued)

(56) References Cited

U.S. PATENT DOCUMENTS 6,743,669 B1 6/2004 Lin et al.
8,884,366 B2 11/2014 Dong et al.
(Continued)

FOREIGN PATENT DOCUMENTS

CN 101814699 A 8/2010
TW 201438057 A 10/2014

OTHER PUBLICATIONS

Office Action and Search Report mailed on May 20, 2024 related to U.S. Appl. No. 18/382,214.
(Continued)

*Primary Examiner* — Jose R Diaz
(74) *Attorney, Agent, or Firm* — Xuan Zhang

(57) ABSTRACT

The present application discloses a semiconductor device including a first isolation structure, a second isolation structure, and a third isolation structure disposed in a semiconductor substrate. The semiconductor device further includes a transistor and a resistor. The transistor is disposed between the first isolation structure and the second isolation structure, and includes a gate electrode and a first source/drain (S/D) region. The resistor is disposed between the second isolation structure and the third isolation structure, and includes a resistor electrode. The first S/D region is disposed between the gate electrode and the second isolation structure, and is electrically connected to the resistor electrode.

10 Claims, 42 Drawing Sheets

Related U.S. Application Data which is a division of application No. 17/014,432, filed on Sep. 8, 2020, now Pat. No. 11,380,553.

(51) Int. Cl.
*H10P 76/40* (2026.01)
*H10W 20/00* (2026.01)

(52) U.S. Cl.
CPC .............. *H10P 50/71* (2026.01); *H10P 50/73* (2026.01); *H10P 76/4085* (2026.01); *H10P 76/4088* (2026.01); *H10W 20/089* (2026.01)

(58) Field of Classification Search
CPC ........ H10P 50/696; H10P 50/71; H10P 50/73; H10P 76/4088; H10P 50/695; H10P 76/4085
See application file for complete search history.

(56) References Cited

U.S. PATENT DOCUMENTS

| | | | | |
|---|---|---|---|---|
| 2015/0084183 | A1 | 3/2015 | Patzer et al. | |
| 2015/0087150 | A1 | 3/2015 | Wang et al. | |
| 2018/0182750 | A1* | 6/2018 | Burke | H10D 84/811 |
| 2019/0148147 | A1 | 5/2019 | Huang et al. | |
| 2020/0018875 | A1 | 1/2020 | Mohanty et al. | |
| 2021/0305238 | A1* | 9/2021 | Huang | H10D 84/811 |
| 2022/0076959 | A1* | 3/2022 | Yeh | H10P 50/695 |
| 2022/0093490 | A1 | 3/2022 | Huang | |

OTHER PUBLICATIONS

Office Action and and the search report mailed on Mar. 19, 2025 related to China Application No. 202110880396.3.
Summary translation of Office Action and English Abstracts of foreign patent documents related to China Application No. 202110880396.3.

* cited by examiner

SEMICONDUCTOR DEVICE, SEMICONDUCTOR STRUCTURE AND METHOD FOR FABRICATING SEMICONDUCTOR DEVICE AND SEMICONDUCTOR STRUCTURE USING TILTED ETCH PROCESS

CROSS-REFERENCE TO RELATED APPLICATION

This application is a continuation-in-part application of U.S. Non-Provisional application Ser. No. 17/572,807 filed Jan. 11, 2022, which is a divisional application of U.S. Non-Provisional application Ser. No. 17/014,432 filed Sep. 8, 2020. Those are incorporated herein by reference in their entireties.

TECHNICAL FIELD

The present disclosure relates to a method for fabricating a semiconductor device, and more particularly, to a method for fabricating a semiconductor device using a tilted etch process.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first isolation structure, a second isolation structure, and a third isolation structure disposed in a semiconductor substrate. The semiconductor device further includes a transistor and a resistor. The transistor is disposed between the first isolation structure and the second isolation structure, and includes a gate electrode and a first source/drain (S/D) region. The resistor is disposed between the second isolation structure and the third isolation structure, and includes a resistor electrode. The first S/D region is disposed between the gate electrode and the second isolation structure, and is electrically connected to the resistor electrode.

In some embodiments, the transistor further include a second S/D region disposed between the first isolation structure and the gate electrode.

In some embodiments, the transistor further includes a first dielectric layer in contact with the first S/D region, the second S/D region, and the gate electrode. The gate electrode is separated from the first S/D region and the second S/D region by the first dielectric layer.

In some embodiments, the semiconductor device further includes a patterned interlayer dielectric (ILD) layer disposed over the semiconductor substrate. The patterned ILD layer is in contact with the first dielectric layer and the gate electrode.

In some embodiments, the first S/D region and the second S/D region are exposed by the patterned ILD layer.

In some embodiments, the resistor further includes a well region and a second dielectric layer. The well region is disposed below the resistor electrode. The second dielectric layer is in contact with the resistor electrode and the well region. The well region is separated from the resistor electrode by the second dielectric layer.

In some embodiments, the second dielectric layer is extended to a top surface of the first isolation structure and a top surface of the first S/D region.

In some embodiments, a bottom surface of the well region is higher than a bottom surface of the second isolation structure and a bottom surface of the third isolation structure.

In some embodiments, the patterned ILD layer is further in contact with the second dielectric layer and the resistor electrode.

In some embodiments, a portion of the resistor electrode is exposed by the patterned ILD layer.

Another aspect of the present disclosure provides a method for fabricating a semiconductor device. The method includes: providing a semiconductor substrate; forming a first isolation structure, a second isolation structure, and a third isolation structure in the semiconductor substrate; forming a transistor between the first isolation structure and the second isolation structure; forming a resistor between the second isolation structure and the third isolation structure; and performing a first tilted etch process and a second tilted etch process to form a patterned interlayer dielectric (ILD) layer over the transistor and the resistor.

In some embodiments, performing the first tilted etch process and the second tilted etch process to form the patterned ILD layer over the transistor and the resistor includes: forming an ILD layer over the transistor and the resistor; forming a first hard mask layer over the ILD layer; forming a second hard mask layer over the first hard mask layer; performing the first tilted etch process to form a plurality of first openings in the first hard mask layer; and performing the second tilted etch process to form a plurality of second openings in the first hard mask layer.

In some embodiments, an angle of incidence of the first tilted etch process is symmetric to an angle of incidence of the second tilted etch process.

In some embodiments, the angle of incidence of the first tilted etch process is between 20 degree and 40 degree.

In some embodiments, the angle of incidence of the first tilted etch process is between 20 degree and 60 degree.

In some embodiments, the angle of incidence of the first tilted etch process is between 10 degree and 80 degree.

In some embodiments, the angle of incidence of the first tilted etch process is defined by a height of the second hard mask layer and a width of the first hard mask layer exposed by the second hard mask layer.

In some embodiments, the second hard mask layer has openings to expose the first hard mask layer, and the second hard mask layer has a first side and a second side with respect to the openings, wherein the first side is opposite to the second side.

In some embodiments, the plurality of first openings and the plurality of second openings are formed along the first hard mask layer.

In some embodiments, the plurality of first openings are formed adjacent to the first side of the second hard mask layer.

In some embodiments, the plurality of second openings are formed adjacent to the second side of the second hard mask layer.

In some embodiments, a width of each of the plurality of first opening is substantially equal to a width of each of the plurality of second openings.

In some embodiments, performing the first tilted etch process and the second tilted etch process to form the patterned ILD layer over the transistor and the resistor further include: removing the second hard mask layer after the plurality of first openings and the plurality of second openings are formed; and performing a target layer etch process to etch the ILD layer, so as to pattern the IDL layer to form the patterned ILD layer.

In some embodiments, performing the first tilted etch process and the second tilted etch process to form the patterned ILD layer over the transistor and the resistor further includes: removing the first hard mask layer after the patterned ILD layer is formed.

In some embodiments, the target layer etch process is performed according to the plurality of first openings and the plurality of second openings.

In some embodiments, forming the transistor between the first isolation structure and the second isolation structure includes: forming a first S/D region and a second S/D region in the semiconductor substrate; forming a first dielectric layer over the first S/D region and the second S/D region; and forming a gate electrode over the first dielectric layer, wherein the gate electrode is separated from the first S/D region and the second S/D region by the first dielectric layer.

In some embodiments, forming the resistor between the second isolation structure and the third isolation structure includes: forming a well region in the semiconductor substrate; forming a second dielectric layer over the well region; and forming a resistor electrode over the second dielectric layer. The resistor electrode is separated from the well region by the second dielectric layer.

In some embodiments, the first dielectric layer and the second dielectric layer are formed by a single process.

Another aspect of the present disclosure provides a method for fabricating a semiconductor structure. The method includes: providing a semiconductor substrate; forming a first ring structure on the semiconductor substrate; forming a dielectric layer over the semiconductor substrate; forming a second ring structure over an external sidewall of the first ring structure; and forming a third ring structure over an internal sidewall of the first ring structure. Forming a third ring structure over an internal sidewall of the first ring structure includes: forming a cylinder structure to fill the first ring structure; and performing a tilted etch process to remove a central portion of the cylinder structure to form the third ring structure.

In some embodiments, the dielectric layer is further to cover a top surface of the first ring structure.

In some embodiments, a width of the first ring structure is substantially equal to a width of the second ring structure.

In some embodiments, a width of the first ring structure is substantially equal to a width of the third ring structure.

In some embodiments, a width of the first ring structure is substantially equal to an inner diameter of the third ring structure.

In some embodiments, the tilted etch process is performed with a 360 degree rotation.

In some embodiments, forming the third ring structure over an internal sidewall of the first ring structure further includes: forming a patterned hard mask over the dielectric layer and the second ring structure; and removing the patterned hard mask after the third ring structure is formed.

Due to the design of the semiconductor device of the present disclosure, the first openings and the second openings may be formed without additional photolithography process on the first hard mask layer by using the first tilted etch process and the second tilted etch process. Hence, the complexity of fabrication of the semiconductor device may be reduced. In addition, the narrower first openings and the narrower second openings may be formed using second hard mask layers having wider hard mask openings. That is, the requirements of photolithography process for forming the narrower first openings and the second openings may be alleviated. As a result, the yield of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
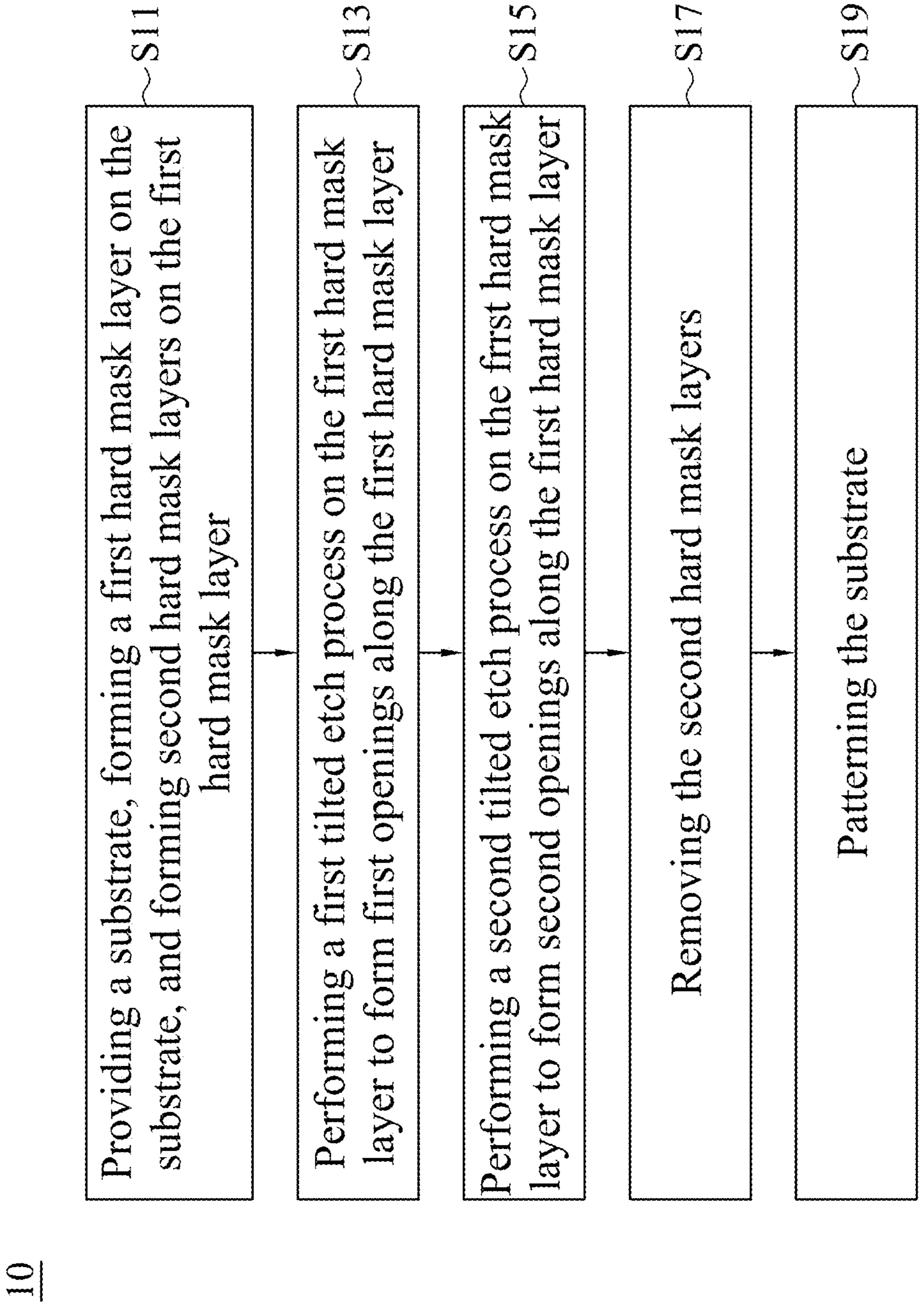
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 6 illustrate, in schematic cross-sectional view diagrams, a flow for fabricating the semiconductor device 1A in accordance with one embodiment of the present disclosure.

Figure 2:
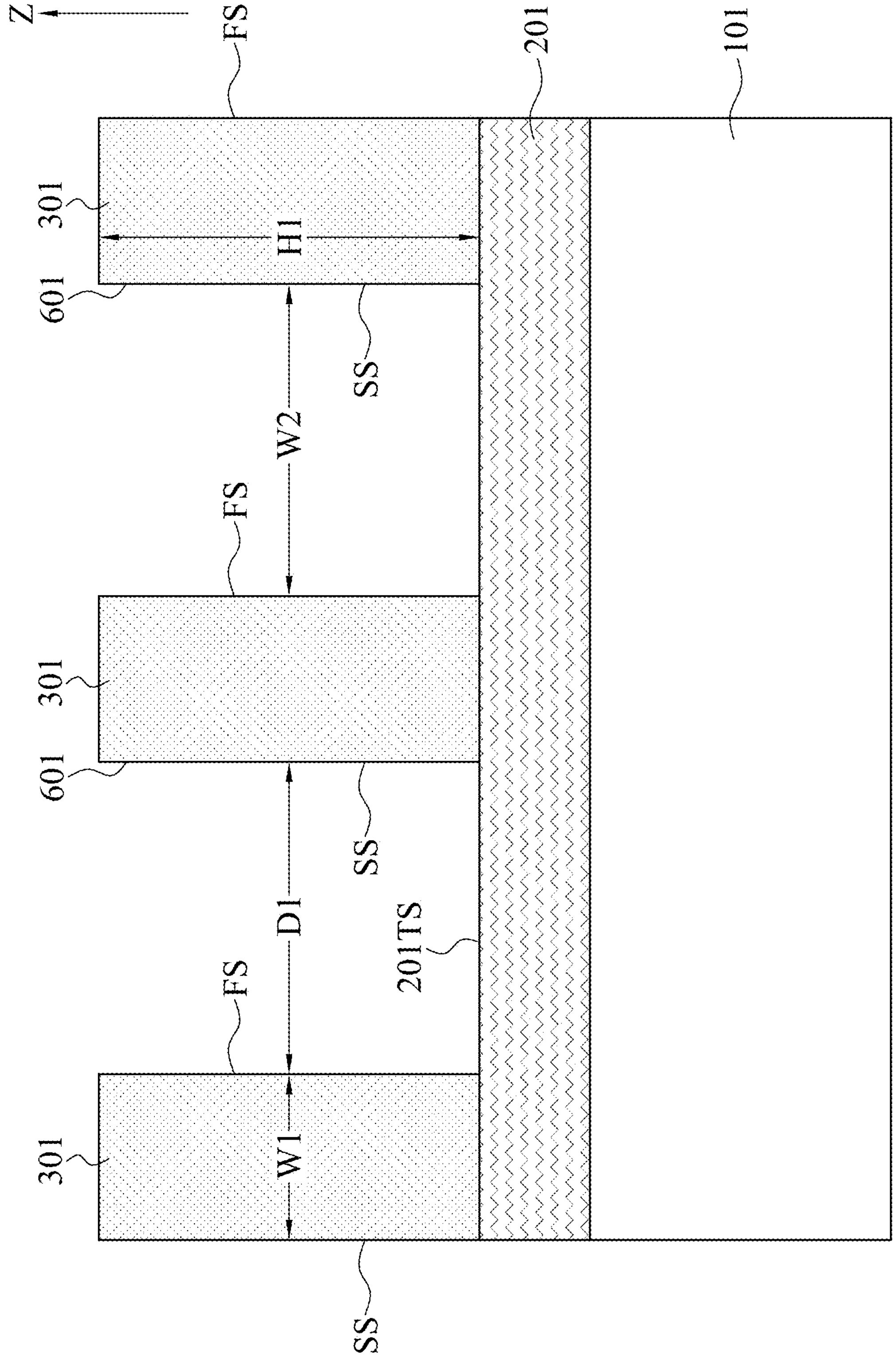
FIGS. 2 to 6 illustrate, in schematic cross-sectional view diagrams, a flow for fabricating the semiconductor device in accordance with one embodiment of the present disclosure.

With reference to FIGS. 1 and 2, at step S11, a substrate 101 may be provided, a first hard mask layer 201 may be formed on the substrate 101, and second hard mask layers 301 may be formed on the first hard mask layer 201.

With reference to FIG. 2, in some embodiments, the substrate 101 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; a non-semiconductor material, such as soda-lime glass, fused silica, fused quartz, calcium fluoride; other suitable materials; or combinations thereof.

With reference to FIG. 2, in some embodiments, the first hard mask layer 201 may be formed of, for example, silicon oxide, silicon nitride, silicon oxynitride, silicon nitride oxide, the like, or a combination thereof. The first hard mask layer 201 may be formed by deposition processes such as chemical vapor deposition, plasma enhanced chemical vapor deposition, low pressure chemical vapor deposition, or the like.

It should be noted that, in description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Alternatively, in some embodiments, the first hard mask layer 201 may be formed of, for example, boron nitride, silicon boron nitride, phosphorus boron nitride, or boron carbon silicon nitride. The first hard mask layer 201 may be formed by a film formation process and a treatment process. Specifically, in the film formation process, first precursors, which may be boron-based precursors, may be introduced over the substrate 101 to form a boron-based layer. Subsequently, in the treatment process, second precursors, which may be nitrogen-based precursors, may be introduced to react with the boron-based layer and turn the boron-based layer into the first hard mask layer 201.

In some embodiments, the first precursors may be, for example, diborane, borazine, or an alkyl-substituted derivative of borazine. In some embodiments, the first precursors may be introduced at a flow rate between about 5 sccm (standard cubic centimeters per minute) and about 50 slm (standard liter per minute); specifically, between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm; specifically, between about 1 slm and about 10 slm.

In some embodiments, the film formation process may be performed without an assistant of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr. The plasma may be provided by a RF power between 2 W and 5000 W. For example, the RF power of the plasma may be between 30 W and 1000 W.

In some embodiments, the second precursors may be, for example, ammonia or hydrazine. In some embodiments, the second precursors may be introduced at a flow rate between about 5 sccm and about 50 slm; specifically, between about 10 sccm and about 1 slm.

In some embodiments, oxygen-based precursors may be together introduced with the second precursors in the treatment process. The oxygen-based precursors may be, for example, oxygen, nitric oxide, nitrous oxide, carbon dioxide, or water.

In some embodiments, silicon-based precursors may be together introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be together introduced with the second precursors in the treatment process. The phosphorus-based precursors may be, for example, phosphine.

In some embodiments, oxygen-based precursors, silicon-based precursors, or phosphorus-based precursors may be together introduced with the second precursors in the treatment process.

In some embodiments, the treatment process may be performed with an assistant of a plasma process, an UV cure process, a thermal anneal process, or a combination thereof.

When the treatment is performed with the assistant of the plasma process. Plasma of the plasma process may be provided by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency of greater than about 13.6 MHz. In such situation, a substrate temperature of the treatment process may be between about 20° C. and about 1000° C. A process pressure of the treatment process may be between about 10 mTorr and about 760 Torr.

When the treatment is performed with the assistant of UV cure process, in such situation, a substrate temperature of the treatment process may be between about 20° C. and about 1000° C. A process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV; specifically, between about 1 eV and about 6 eV. The assistant of the UV cure process may remove hydrogen from the first hard mask layer 201. As hydrogen may diffuse through into other areas of the semiconductor device 1A and may degrade the reliability of the semiconductor device 1A, the removal of hydrogen by the assistant of UV cure process may improve the reliability of the semiconductor device 1A. In addition, the UV cure process may increase the density of the first hard mask layer 201.

When the treatment is performed with the assistant of the thermal anneal process. In such situation, a substrate temperature of the treatment process may be between about 20° C. and about 1000° C. A process pressure of the treatment process may be between about 10 mTorr and about 760 Torr.

Alternatively, in some embodiments, the first hard mask layer 201 may be formed of, for example, a carbon film. The terms "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon. These terms do include, for example, graphite, charcoal and halocarbons.

In some embodiments, the carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof.

In some embodiments, partially or completely fluorinated derivatives of the hydrocarbon compounds may be used. The doped derivatives include boron-containing derivatives of the hydrocarbon compounds as well as fluorinated derivatives thereof. The fluorinated hydrocarbon compounds have a formula $C_xH_yF_z$, where x has a range of between 2 and 4, y has a range of between 0 and 10, z has a range of between 0 and 10, with y+z greater than or equal to 2 and less than or equal to 10. Examples include fully fluorinated hydrocarbons, such as $C_3F_8$ or $C_4F_8$, which may be used to deposit a fluorinated carbon film. Additionally, the hydrocarbon compounds may contain nitrogen or be deposited with a nitrogen-containing gas, such as ammonia.

In some embodiments, a combination of hydrocarbon compounds and fluorinated derivatives of hydrocarbon compounds may be together used to deposit the carbon film. In some embodiments, hydrocarbon compounds, and fluorinated derivatives thereof, including alkanes, alkenes, alkynes, cyclic compounds, and aromatic compounds, having five or more carbons, such as pentane, benzene, and toluene, may be used to deposit the carbon film.

In some embodiments, the carbon film may be deposited from the processing gas mixture by maintaining a substrate temperature between about 100° C. and about 700° C.; specifically, between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm. In some embodiments, the carbon film may be deposited with assistance of plasma which is generated by applying a RF power of between about 0.03 $W/cm^2$ and about 20 $W/cm^2$, or between about 10 W and about 6000 W, for example between about 0.3 $W/cm^2$ and about 3 $W/cm^2$, or between about 100 W and about 1000 W.

In some embodiments, a dual-frequency system may be applied to deposit the carbon film. A dual-frequency source of mixed RF power provides a high frequency power and a low frequency power. The high frequency power may be in a range between about 10 MHz and about 30 MHz, for example, about 13.56 MHz. The low frequency power may be in a range of between about 100 KHz and about 500 KHz, for example, about 350 KHz.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance properties, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch selectivity and chemical mechanical polishing resistance properties. As the hydrogen content decreases, the etch resistance, and thus the selectivity, of the carbon film increases. The reduced rate of removal of the carbon film may make the carbon film suitable for being a mask layer when performing an etch process to transfer desire pattern onto the underlying layers.

With reference to FIG. 2, in some embodiments, the second hard mask layers 301 may be formed of, for example, silicon oxide, silicon nitride, silicon oxynitride, silicon nitride oxide, the like, or a combination thereof. The second hard mask layers 301 may be formed by deposition processes such as chemical vapor deposition, plasma enhanced chemical vapor deposition, low pressure chemical vapor deposition, or the like.

Alternatively, in some embodiments, the second hard mask layers 301 may be formed of, for example, boron nitride, silicon boron nitride, phosphorus boron nitride, or boron carbon silicon nitride. The second hard mask layers 301 may be formed by a film formation process and a treatment process similar to the first hard mask layer 201.

Alternatively, in some embodiments, the second hard mask layers 301 may be formed of, for example, a carbon film. The second hard mask layers 301 may be formed by a process using a processing gas mixture similar to the first hard mask layer 201.

The second hard mask layers 301 and the first hard mask layer 201 may be formed of different materials; specifically, the second hard mask layers 301 and the first hard mask layer 201 may be formed of materials having etch selectivity to each other during subsequent processes.

With reference to FIG. 2, each of the second hard mask layers 301 may have a rectangular cross-sectional profile in a cross-sectional perspective. For convenience of description, only one second hard mask layer 301 is described. The second hard mask layer 301 may include two sides, a first side FS and a second side SS. The first side FS and the second side SS are opposite to each other. The first side FS and the second side SS are perpendicular to the top surface 201TS of the first hard mask layer 201.

With reference to FIG. 2, the spaces between adjacent pairs of the second hard mask layers 301 may be referred to as hard mask openings 601. In some embodiments, the ratio of the width W1 of the second hard mask layer 301 to the horizontal distance D1 between an adjacent pair of the second hard mask layers 301 may be between about 1:3 and about 2:3. In some embodiments, the ratio of the width W1 of the second hard mask layer 301 to the horizontal distance D1 between the adjacent pair of the second hard mask layers 301 may be about 1:2. It should be noted that horizontal distance D1 between the adjacent pair of the second hard mask layers 301 may be the same as the width W2 of the hard mask opening 601 or the horizontal distance between the first side FS of one of the second hard mask layers 301 and the second side SS of an adjacent one of the second hard mask layers 301. In some embodiments, a ratio of the width W1 of the second hard mask layers 301 to the height H1 of the hard mask opening 601 (i.e., the height of the second hard mask layers 301) may be between about 3:1 and about 1:12, between about 1:1 and about 1:12, between about 1:1 and about 1:8, or between about 1:2 and about 1:6.

Figure 3:
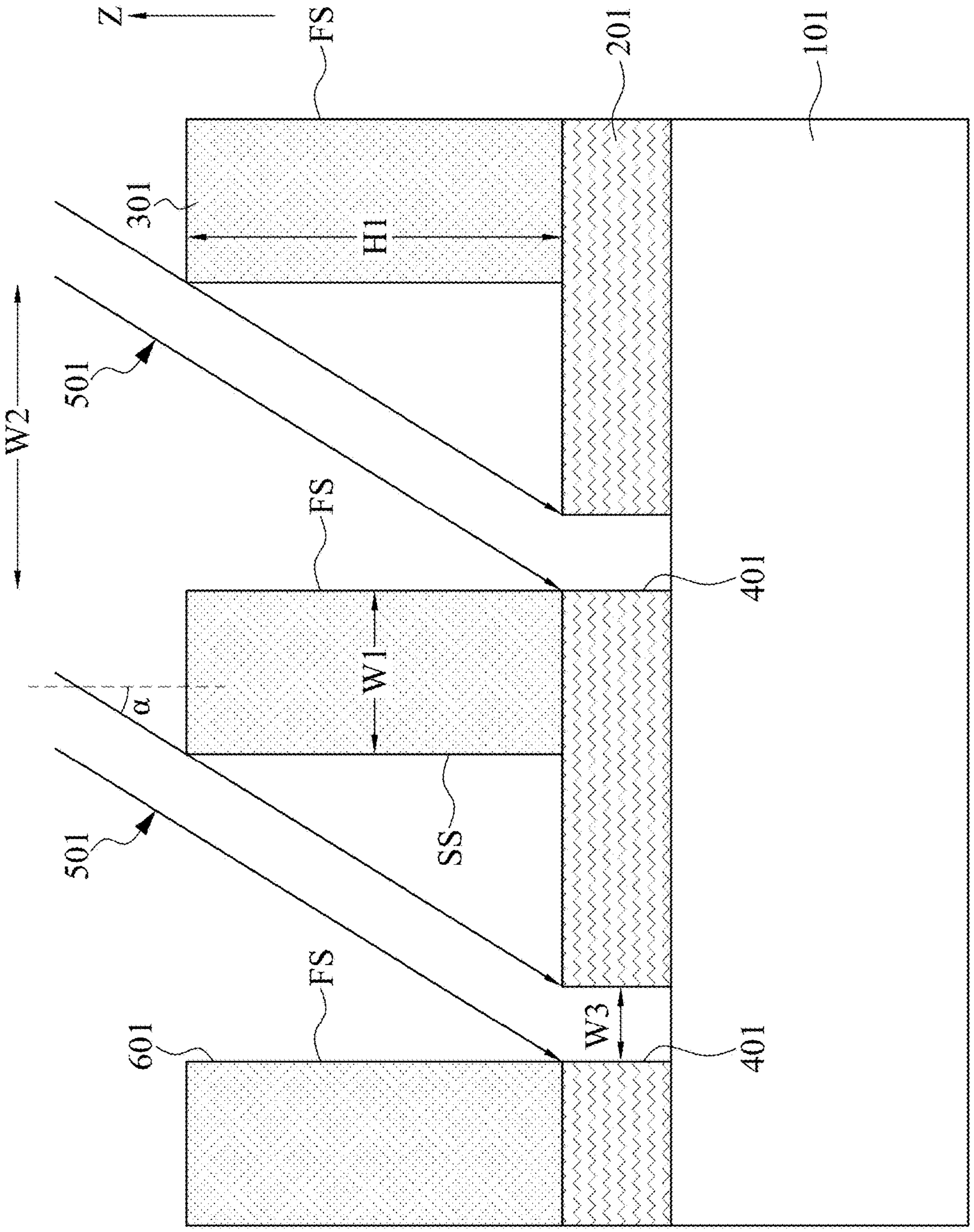

With reference to FIGS. 1 and 3, at step S13, a first tilted etch process 501 may be performed on the first hard mask layer 201 to form first openings 401 along the first hard mask layer 201.

With reference to FIG. 3, the first tilted etch process 501 may use the second hard mask layers 301 as pattern guides to remove portions of the first hard mask layer 201 and concurrently form the first openings 401 along the first hard mask layer 201 and adjacent to the first sides FS of the second hard mask layers 301. In some embodiments, the angle of incidence α of the first tilted etch process 501 may be define by the width W2 of the hard mask opening 601 and the height H1 of the hard mask opening 601. In some embodiments, the angle of incidence α of the first tilted etch process 501 may be between about 10 degree and about 80 degree. In some embodiments, the angle of incidence α of the first tilted etch process 501 may be between about 20 degree and about 60 degree. In some embodiments, the angle of incidence α of the first tilted etch process 501 may be between about 20 degree and about 40 degree.

In some embodiments, the first tilted etch process 501 may be an anisotropic etch process such as a reactive ion etching process. The reactive ion etching process may include etchant gases and passivation gases which may suppress the isotropic effect to limit the removal of material in the horizontal direction. The etchant gases may include chlorine gas and boron trichloride. The passivation gases may include fluoroform or other suitable halocarbons. In some embodiments, the second hard mask layers 301 formed of carbon film may serve as a halocarbon source for the passivation gases of the reactive ion etching process.

In some embodiments, the etch rate of the first hard mask layer 201 of the first tilted etch process 501 may be faster than the etch rate of the second hard mask layers 301 of the first tilted etch process 501. For example, an etch rate ratio of the first hard mask layer 201 to the second hard mask layers 301 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the first tilted etch process 501. In some embodiments, an etch rate ratio of the first hard mask layer 201 to the substrate 101 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the first tilted etch process 501.

In some embodiments, a ratio of the width W3 of the first openings 401 to the width W1 of the second hard mask layers 301 may be between about 1:3 and about 2:3. In some embodiments, the ratio of the width W3 of the first openings 401 to the width W1 of the second hard mask layers 301 may be about 1:2. In some embodiments, a ratio of the width W3 of the first openings 401 to the width W2 of the hard mask opening 601 may be between about 1:5 and about 2:5. In some embodiments, the ratio of the width W3 of the first openings 401 to the width W2 of the hard mask opening 601 may be 1:4.

Figure 4:
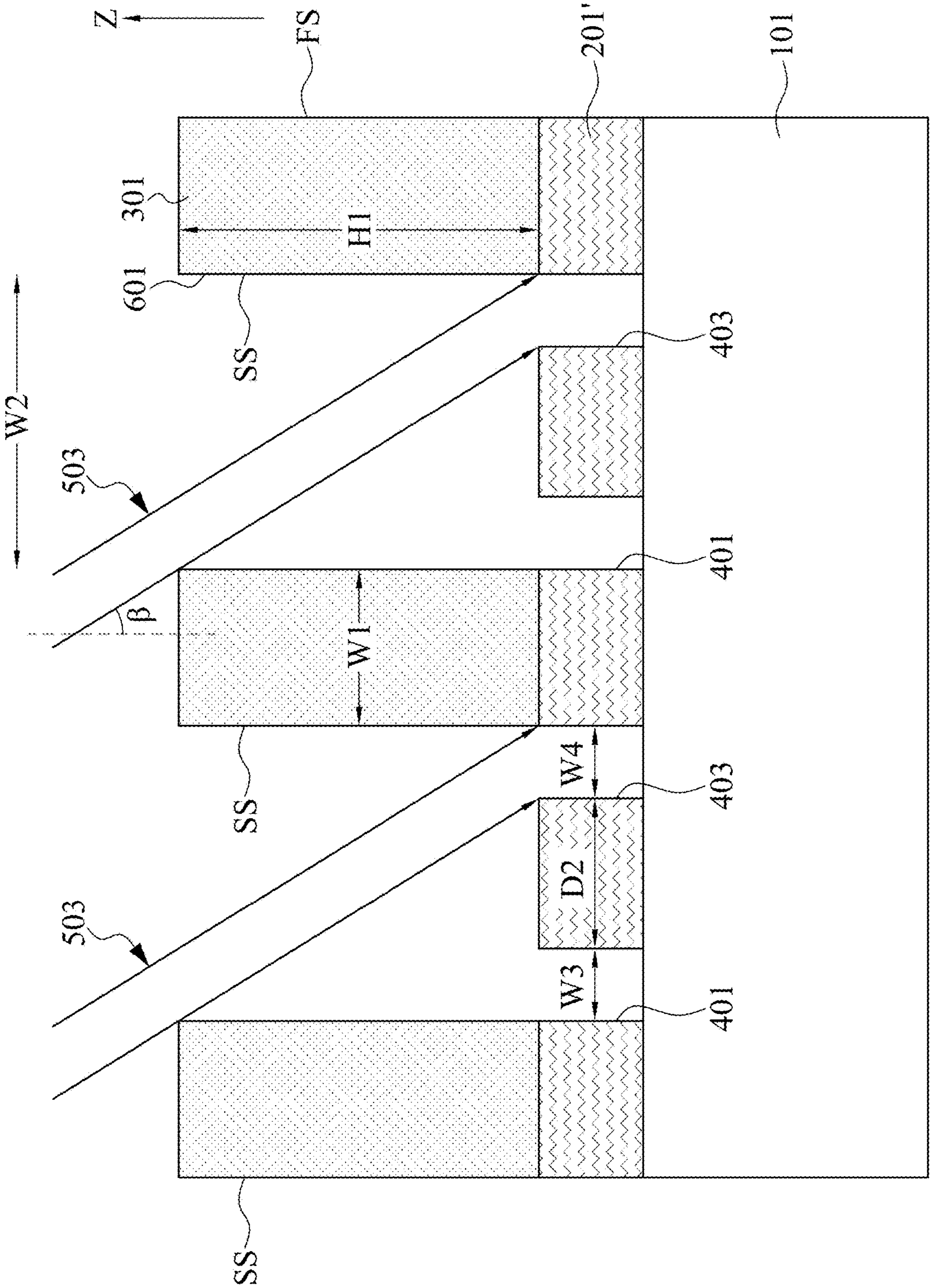

With reference to FIGS. 1 and 4, at step S15, a second tilted etch process 503 may be performed on the first hard mask layer 201 to form second openings 403 along the first hard mask layer 201.

With reference to FIG. 4, the second tilted etch process 503 may use the second hard mask layers 301 as pattern guides to remove portions of the first hard mask layer 201 and concurrently form the second openings 403 along the first hard mask layer 201 and adjacent to the second sides SS of the second hard mask layers 301.

In some embodiments, the angle of incidence β of the second tilted etch process 503 may be define by the width W2 of the hard mask opening 601 and the height H1 of the hard mask opening 601. In some embodiments, the angle of incidence β of the second tilted etch process 503 may have a same value as the angle of incidence α of the first tilted etch process 501 but the incidence direction of the second tilted etch process 503 may be opposite to the incidence direction of the first tilted etch process 501. In other words, the angle of incidence β of the second tilted etch process 503 may be opposite to the angle of incidence α of the first tilted etch process 501. In such situation, the width W4 of the second openings 403 may be equal to the width W3 of the first openings 401. A ratio of the width W3 of the first openings 401 (or the width W4 of the second openings 403) to a horizontal distance D2 between one of the first openings 401 and an adjacent one of the second openings 403 may be between about 1:3 and about 2:3, or may be between 1:2.

In some embodiments, the second tilted etch process 503 may be an anisotropic etch process such as a reactive ion etching process. The process parameters of the second tilted etch process 503 may be the same to the first tilted etch process 501 but only the angles of incidence are different. In some embodiments, the angle of incidence β of the second tilted etch process 503 may be between about −10 degree and about −80 degree. In some embodiments, the angle of incidence β of the second tilted etch process 503 may be between about −20 degree and about −60 degree. In some embodiments, the angle of incidence β of the second tilted etch process 503 may be between about −20 degree and about −40 degree.

In some embodiments, a ratio of the width W4 of the second openings 403 to the width W1 of the second hard mask layers 301 may be between about 1:3 and about 2:3. In some embodiments, the ratio of the width W4 of the second openings 403 to the width W1 of the second hard mask layers 301 may be about 1:2. In some embodiments, a ratio of the width W4 of the second openings 403 to the width W2 of the hard mask opening 601 may be between about 1:5 and about 2:5. In some embodiments, the ratio of the width W4 of the second openings 403 to the width W2 of the hard mask opening 601 may be 1:4.

In some embodiments, an etch rate ratio of the first hard mask layer 201 to the second hard mask layers 301 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the second tilted etch process 503. In some embodiments, an etch rate ratio of the first hard mask layer 201 to the substrate 101 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the second tilted etch process 503.

With reference to FIG. 4, after the first tilted etch process 501 and the second tilted etch process 503, the first hard mask layer 201 may be patterned to a patterned first hard mask layer 201' by the first openings 401 and the second openings 403.

Figure 5:
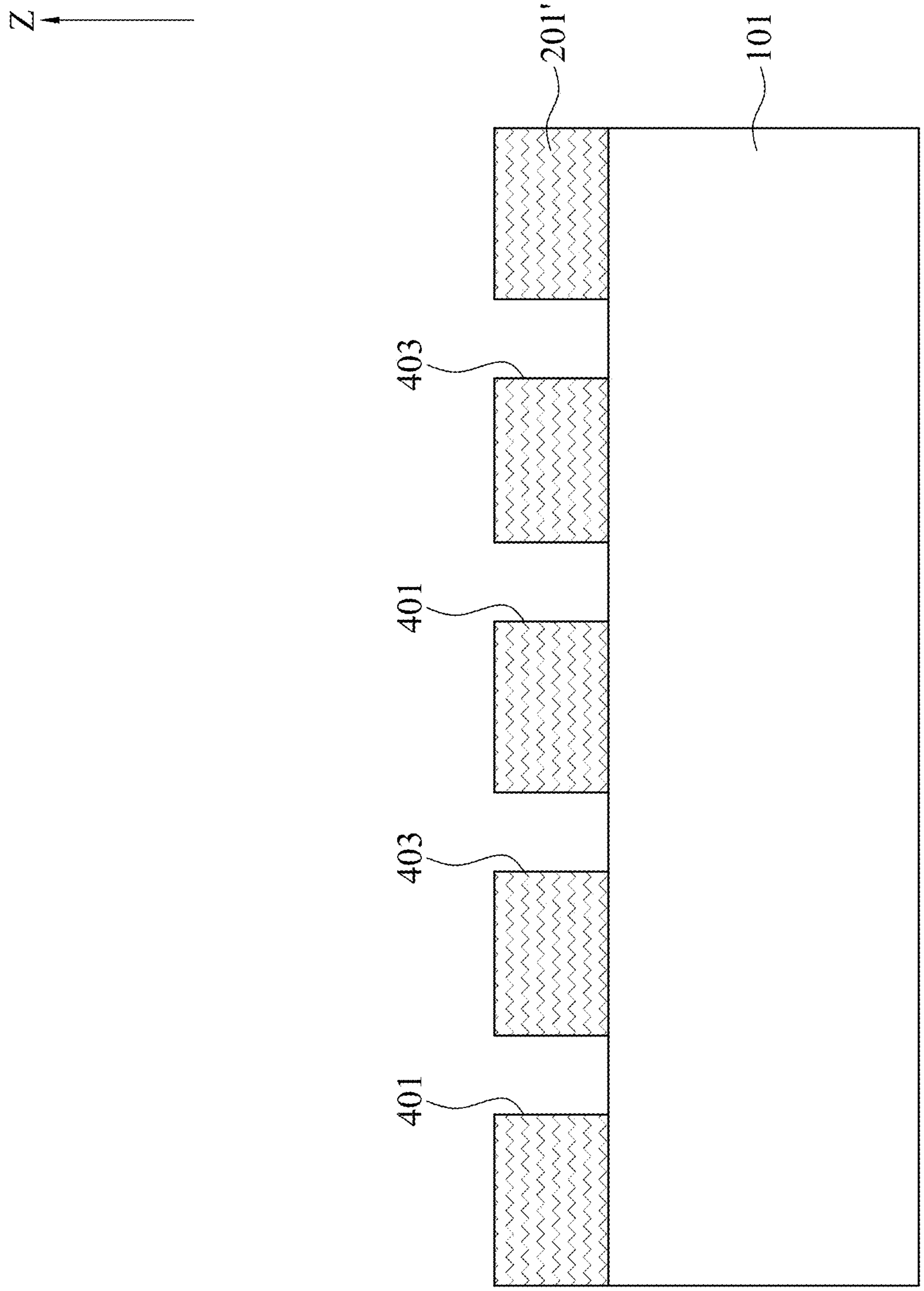

With reference to FIGS. 1 and 5, at step S17, the second hard mask layers 301 may be removed.

With reference to FIG. 5, a hard mask etch process may be performed to remove the second hard mask layers 301. In some embodiments, an etch rate ratio of the second hard mask layers 301 to the patterned first hard mask layer 201' may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the hard mask etch process. In some embodiments, an etch rate ratio of the second hard mask layers 301 to the substrate 101 may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the hard mask etch process. In some embodiments, the hard mask etch process may be an isotropic etch process or an anisotropic etch process.

Figure 6:
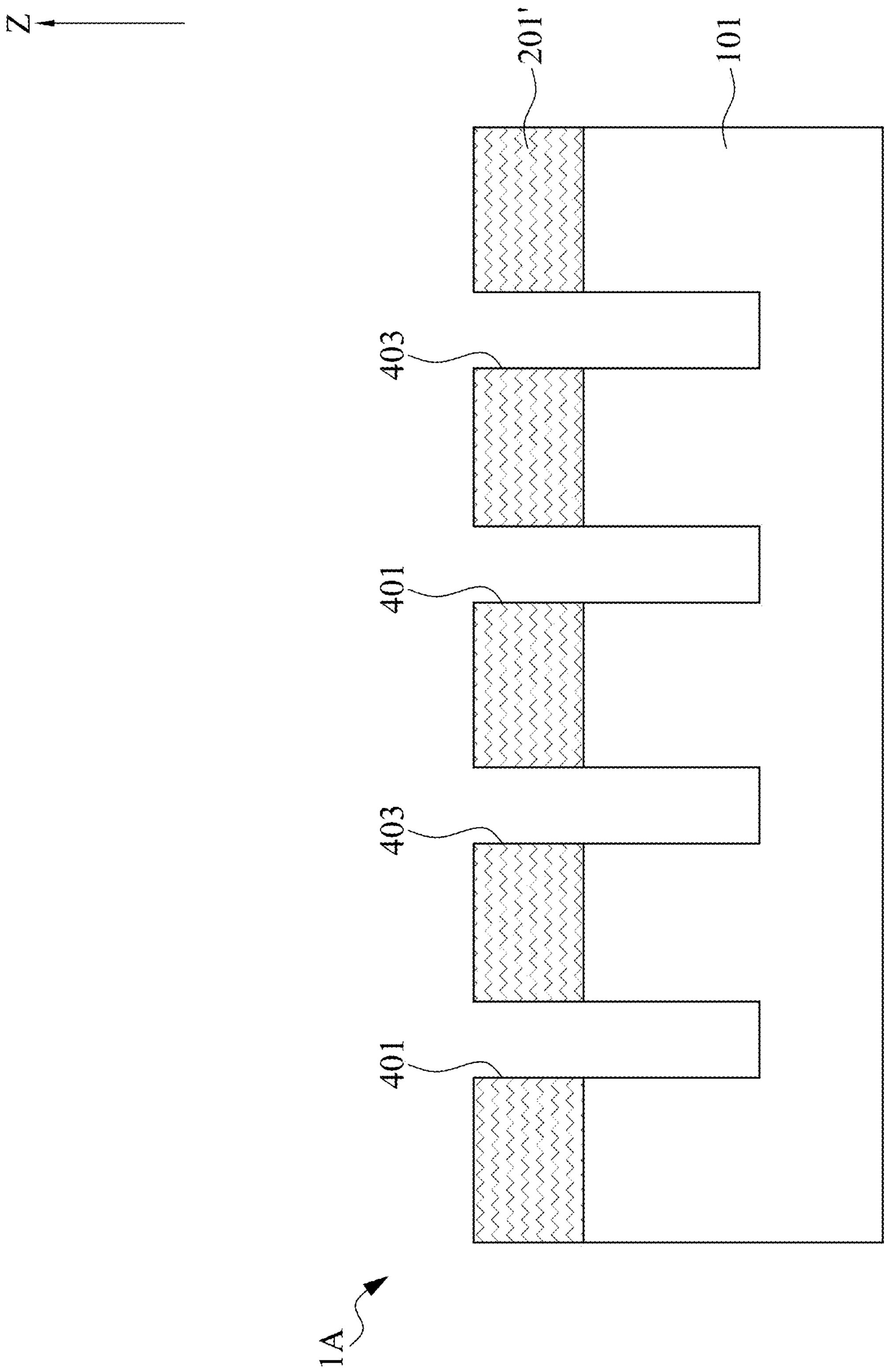

With reference to FIGS. 1 and 6, at step S19, the substrate 101 may be patterned using the patterned first hard mask layer 201' as a mask.

With reference to FIG. 6, a target layer etch process may be performed to remove portions of the substrate 101. After the target layer etch process, the substrate 101 may be turned into a patterned first substrate 101'. In some embodiments, an etch rate ratio of the substrate 101 to the patterned first hard mask layer 201' may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the target layer etch process. The protrusion portions of the patterned first substrate 101' may be employed as fin structures of the semiconductor device 1A. The patterned first hard mask layer 201' may be removed after the patterned first substrate 101' is formed.

Employing the first tilted etch process 501 and the second tilted etch process 503 using the second hard mask layers 301 as the pattern guides, the first openings 401 and the second openings 403 may be formed without additional photolithography process on the first hard mask layer 201. Hence, the complexity of fabrication of the semiconductor device 1A may be reduced. In addition, the narrower first openings 401 and the narrower second openings 403 may be formed using second hard mask layers 301 having wider hard mask openings 601. That is, the requirements of photolithography process for forming the narrower first openings 401 and the second openings 403 may be alleviated. As a result, the yield of the semiconductor device 1A may be improved.

FIGS. 7 to 11 illustrate, in schematic cross-sectional view diagrams, a flow for fabricating a semiconductor device 1B in accordance with another embodiment of the present disclosure.

Figure 7:
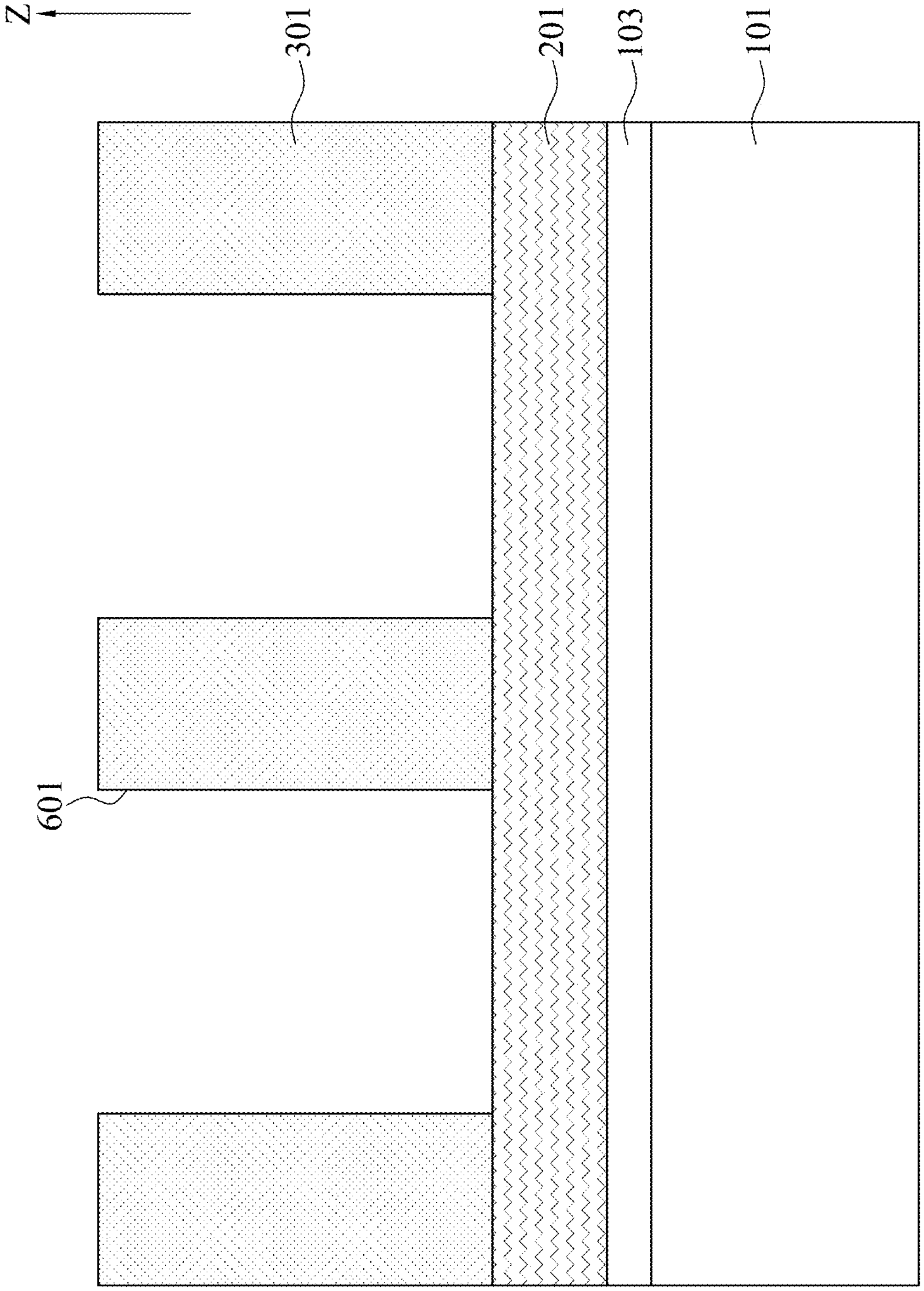
FIGS. 7 to 11 illustrate, in schematic cross-sectional view diagrams, a flow for fabricating a semiconductor device in accordance with another embodiment of the present disclosure.

With reference to FIG. 7, an intermediate semiconductor device having a similar configuration and formed by similar processing to the intermediate semiconductor device illustrated in FIG. 2 is shown. The same or similar elements in FIG. 7 as in FIG. 2 have been marked with similar reference numbers and duplicative descriptions have been omitted.

With reference to FIG. 7, in some embodiments, an etching stop layer 103 may be formed on the substrate 101 and the first hard mask layer 201 may be formed on the etching stop layer 103. The etching stop layer 103 may be formed of, for example, carbon-doped oxide, carbon incorporated silicon oxide, or nitrogen-doped silicon carbide.

Figure 8:
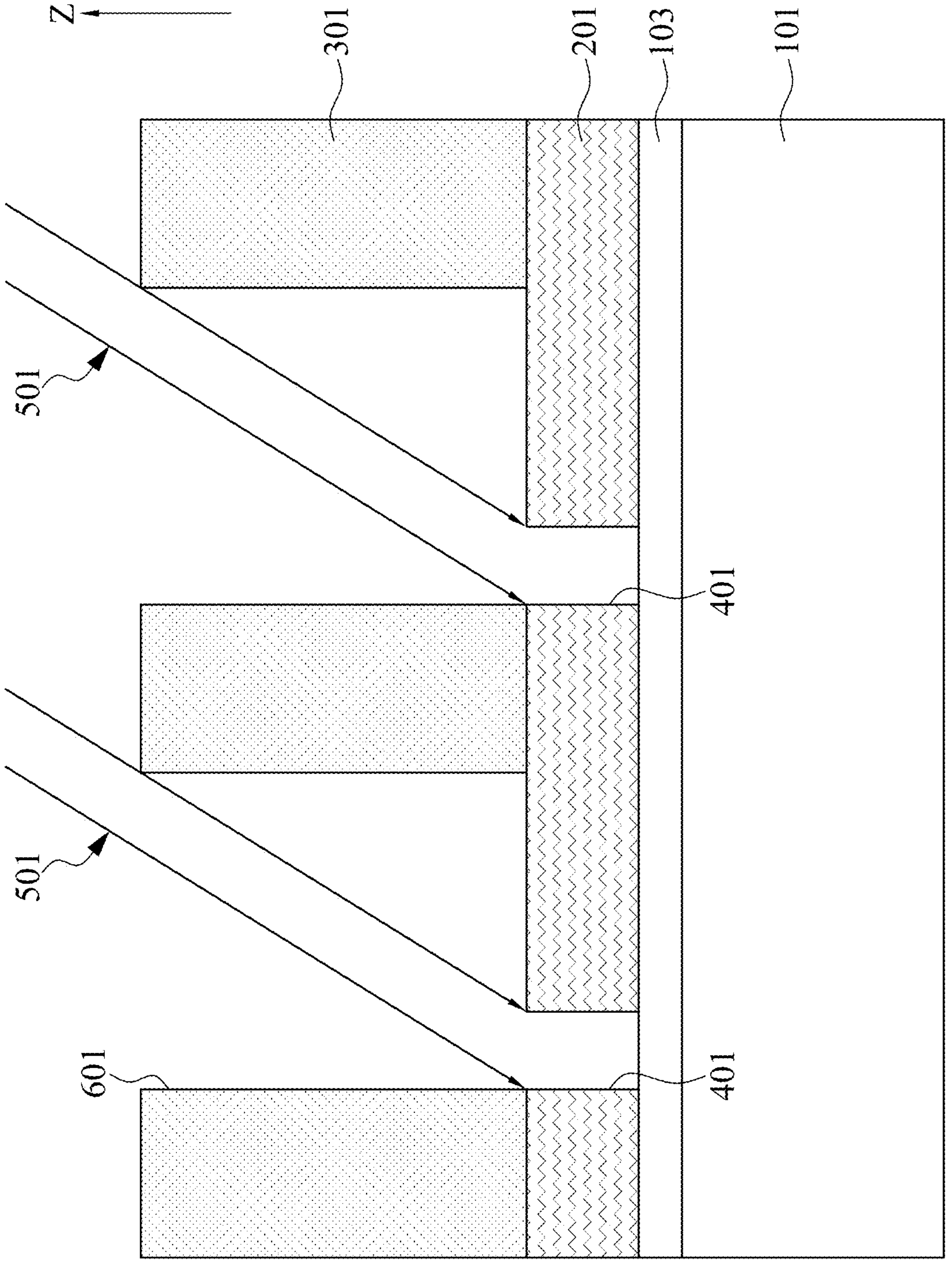

With reference to FIG. 8, a process similar to that illustrated in FIG. 3 may be performed. In some embodiments, an etch rate ratio of the first hard mask layer 201 to the etching stop layer 103 may be between about 100:1 and about 10:1 or between about 15:1 and about 10:1 during the first tilted etch process 501. The etching stop layer 103 may provide additional protection to the underlying substrate 101 during the first tilted etch process 501.

Figure 9:
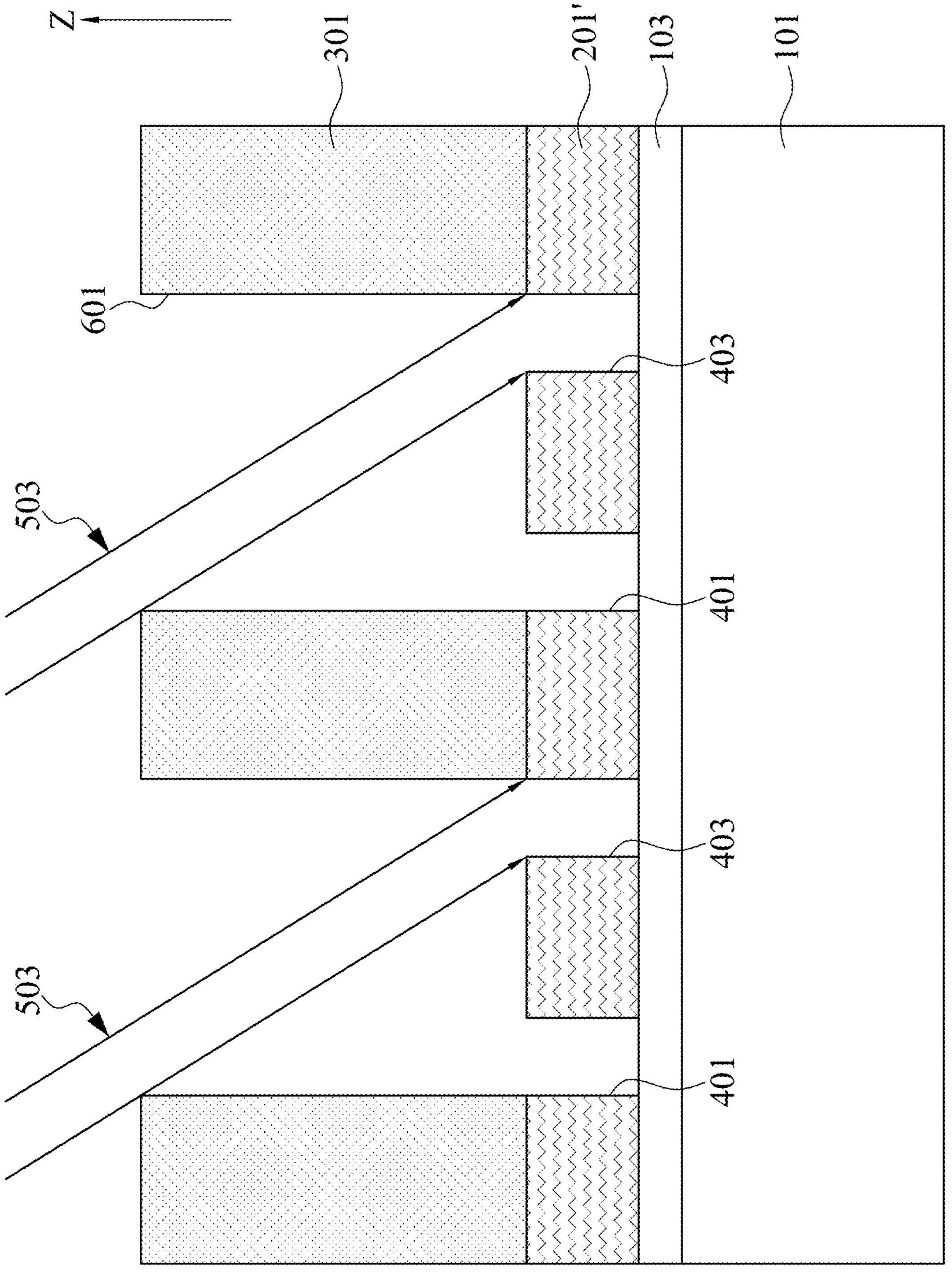

With reference to FIG. 9, a process similar to that illustrated in FIG. 4 may be performed. In some embodiments, an etch rate ratio of the first hard mask layer 201 to the etching stop layer 103 may be between about 100:1 and about 10:1 or between about 15:1 and about 10:1 during the second tilted etch process 503. The etching stop layer 103 may provide additional protection to the underlying substrate 101 during the second tilted etch process 503.

Figure 10:
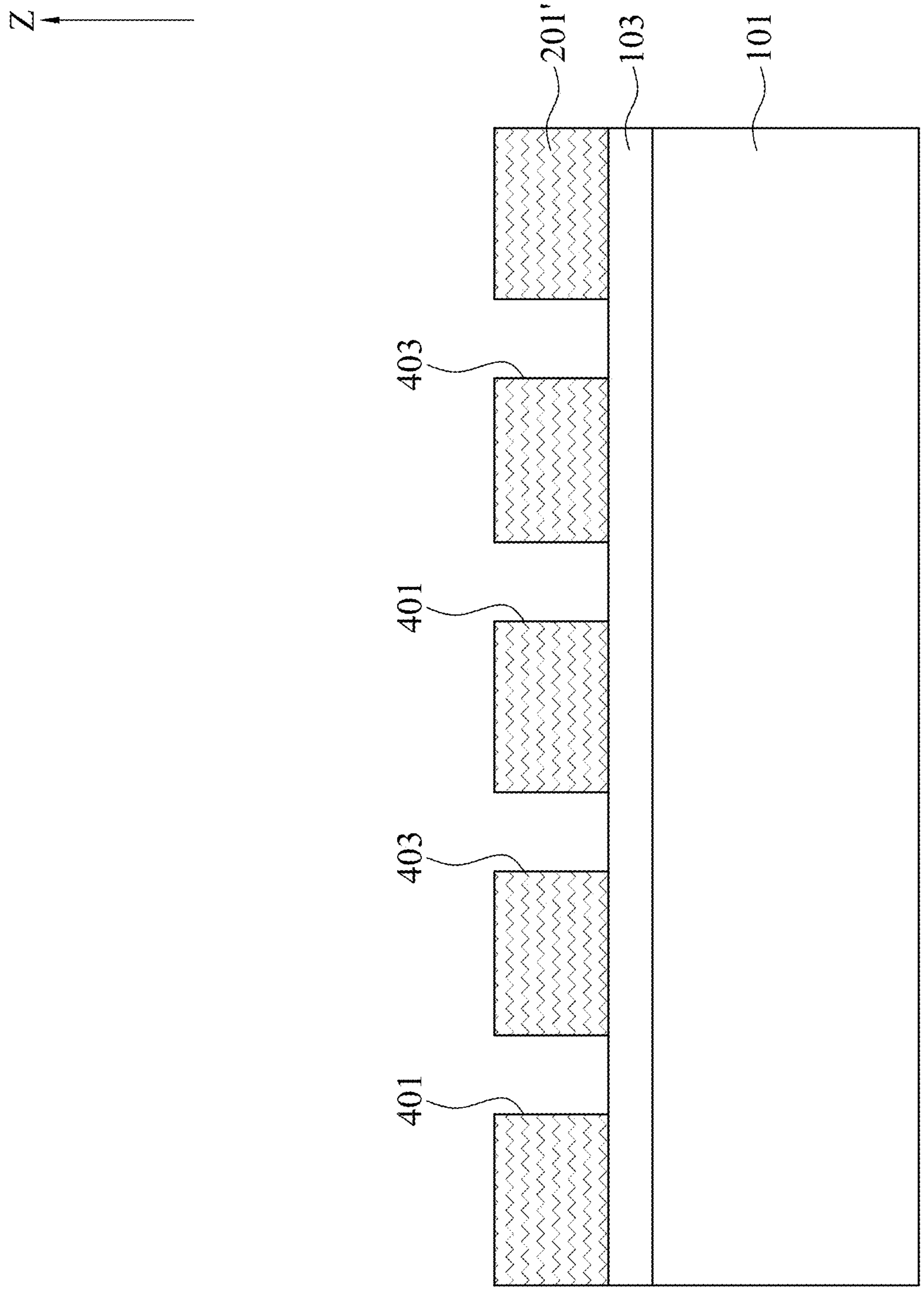

With reference to FIG. 10, a process similar to that illustrated in FIG. 5 may be performed. In some embodiments, an etch rate ratio of the second hard mask layers 301 to the etching stop layer 103 may be between about 100:1 and about 10:1 or between about 15:1 and about 10:1 during the hard mask etch process. The etching stop layer 103 may provide additional protection to the underlying substrate 101 during the hard mask etch process.

Figure 11:
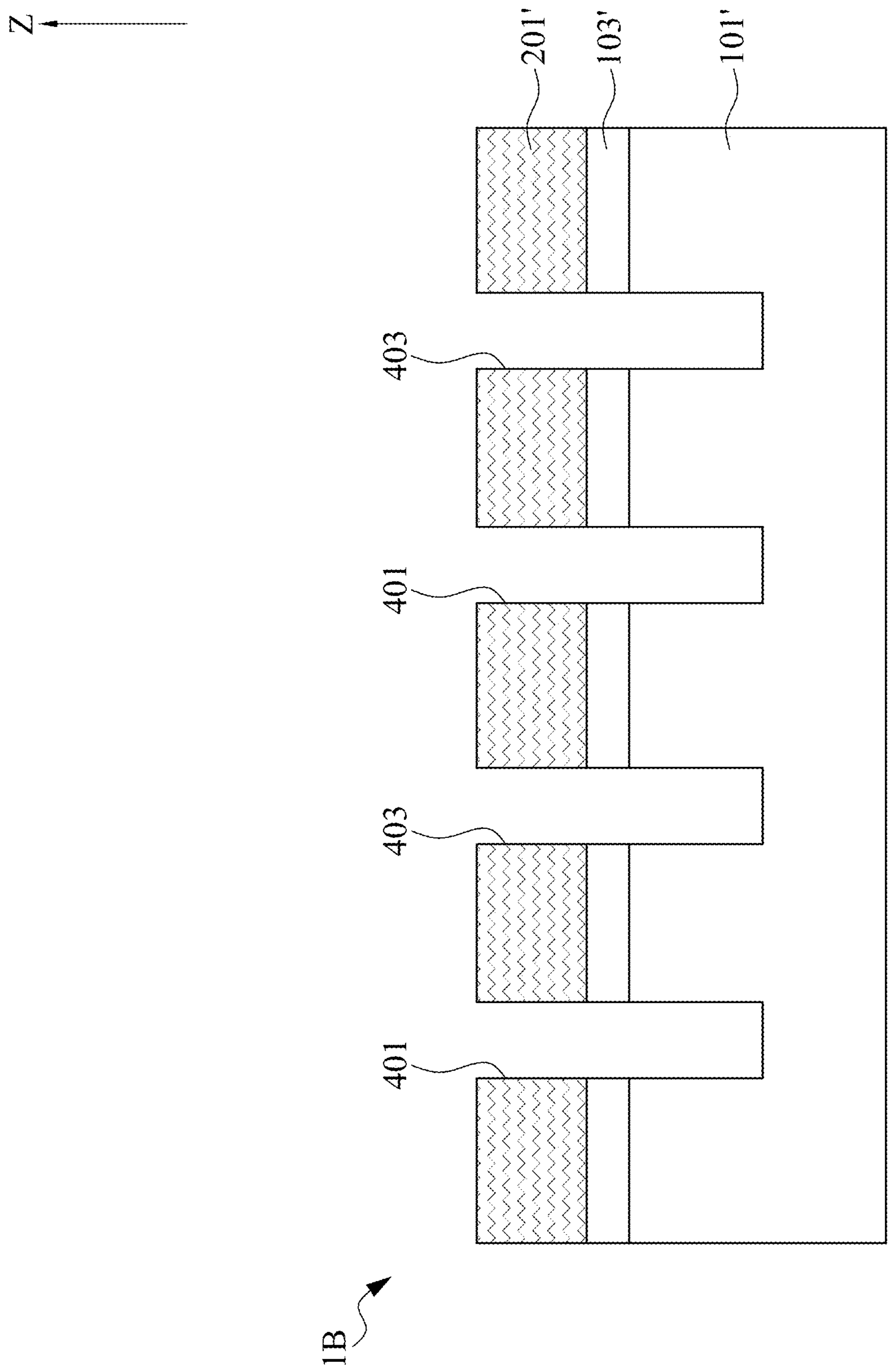

With reference to FIG. 11, a process similar to that illustrated in FIG. 6 may be performed. In some embodiments, an etch rate ratio of the etching stop layer 103 to the patterned first hard mask layer 201' may be between about 100:1 and about 10:1 or between about 15:1 and about 10:1 during the target layer etch process.

FIGS. 12 to 16 illustrate, in schematic cross-sectional view diagrams, a flow for fabricating a semiconductor device 1C in accordance with another embodiment of the present disclosure.

Figure 12:
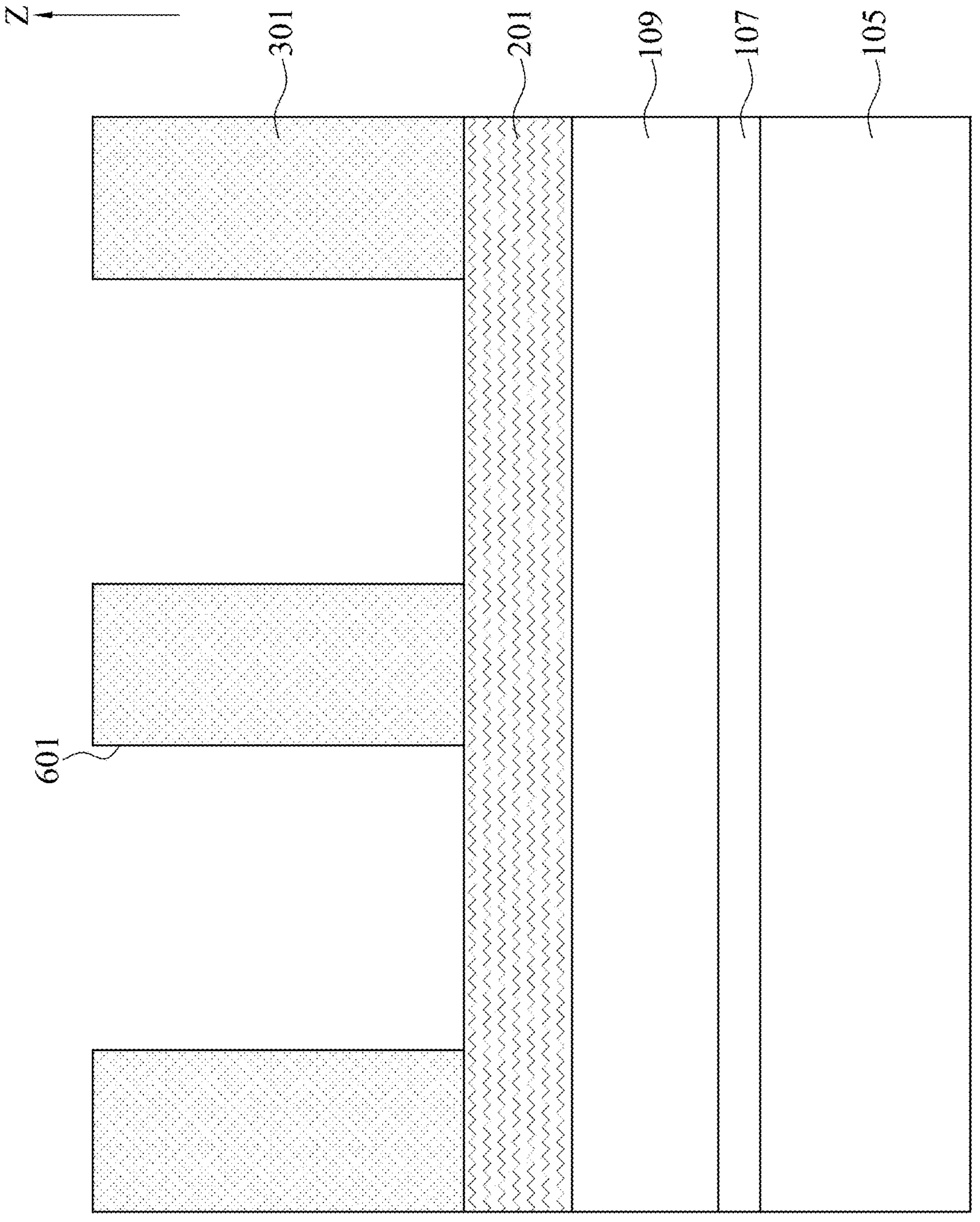
FIGS. 12 to 16 illustrate, in schematic cross-sectional view diagrams, a flow for fabricating a semiconductor device in accordance with another embodiment of the present disclosure.

With reference to FIG. 12, an intermediate semiconductor device having a similar configuration and formed by similar processing to the intermediate semiconductor device illustrated in FIG. 2 is shown. The same or similar elements in FIG. 12 as in FIG. 2 have been marked with similar reference numbers and duplicative descriptions have been omitted.

With reference to FIG. 12, a handle substrate 105 may be provided. An insulator layer 107 may be formed on the handle substrate 105. A topmost semiconductor layer 109 may be formed on the insulator layer 107. The handle substrate 105, the insulator layer 107, and the topmost semiconductor layer 109 together form a semiconductor-on-insulator structure. The handle substrate 105 and the topmost semiconductor layer 109 may be formed of a same material as the substrate 101 illustrated in FIG. 2. The insulator layer may be a crystalline or non-crystalline dielectric material such as an oxide and/or nitride. The insulator layer may have a thickness between about 10 nm and 200 nm. The first hard mask layer 201 may be formed on the topmost semiconductor layer 109. The second hard mask layers 301 may be formed on the first hard mask layer 201.

Figure 13:
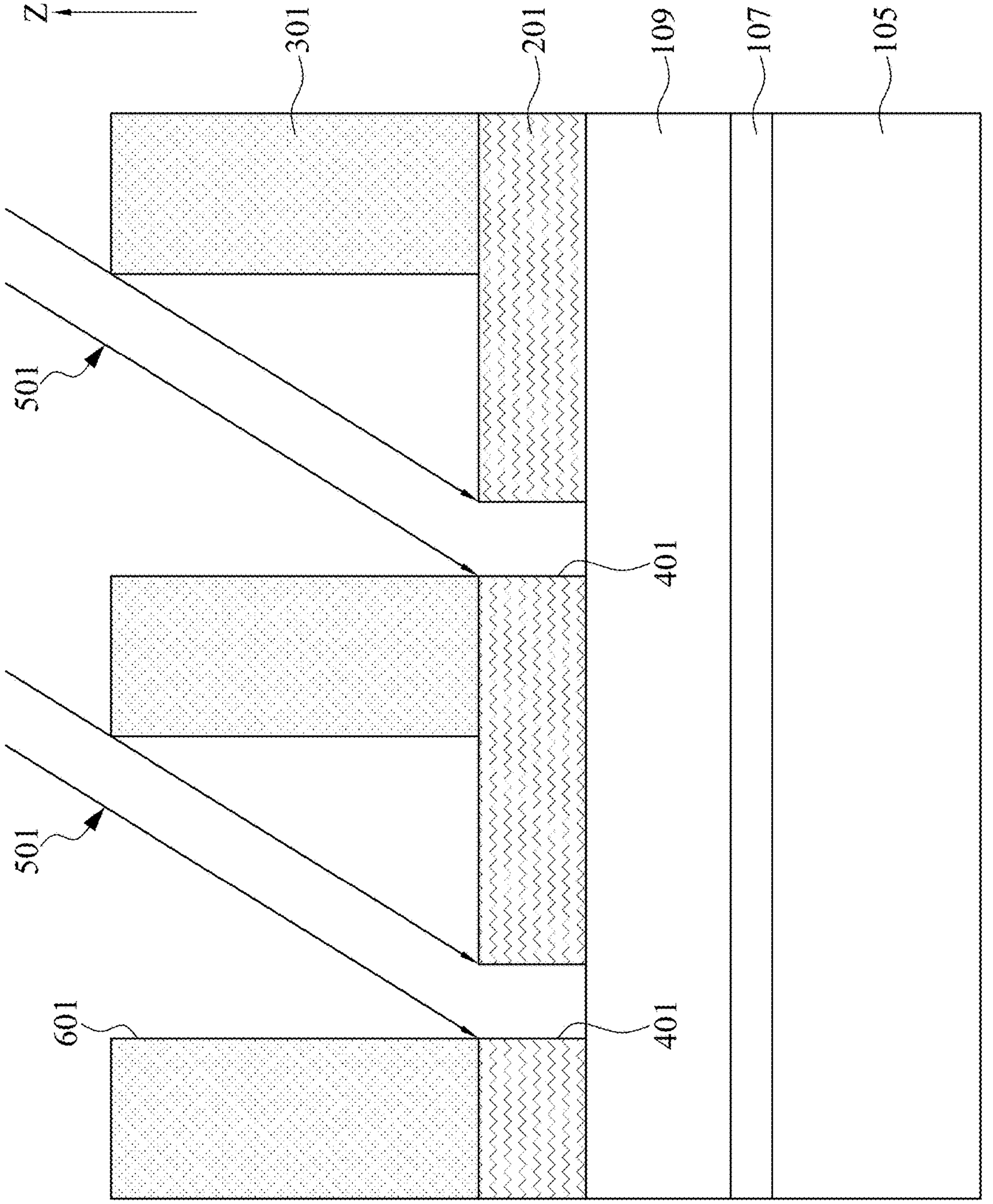

With reference to FIG. 13, a process similar to that illustrated in FIG. 3 may be performed. In some embodiments, an etch rate ratio of the first hard mask layer 201 to the topmost semiconductor layer 109 may be between about 100:1 and about 10:1 or between about 15:1 and about 10:1 during the first tilted etch process 501.

Figure 14:
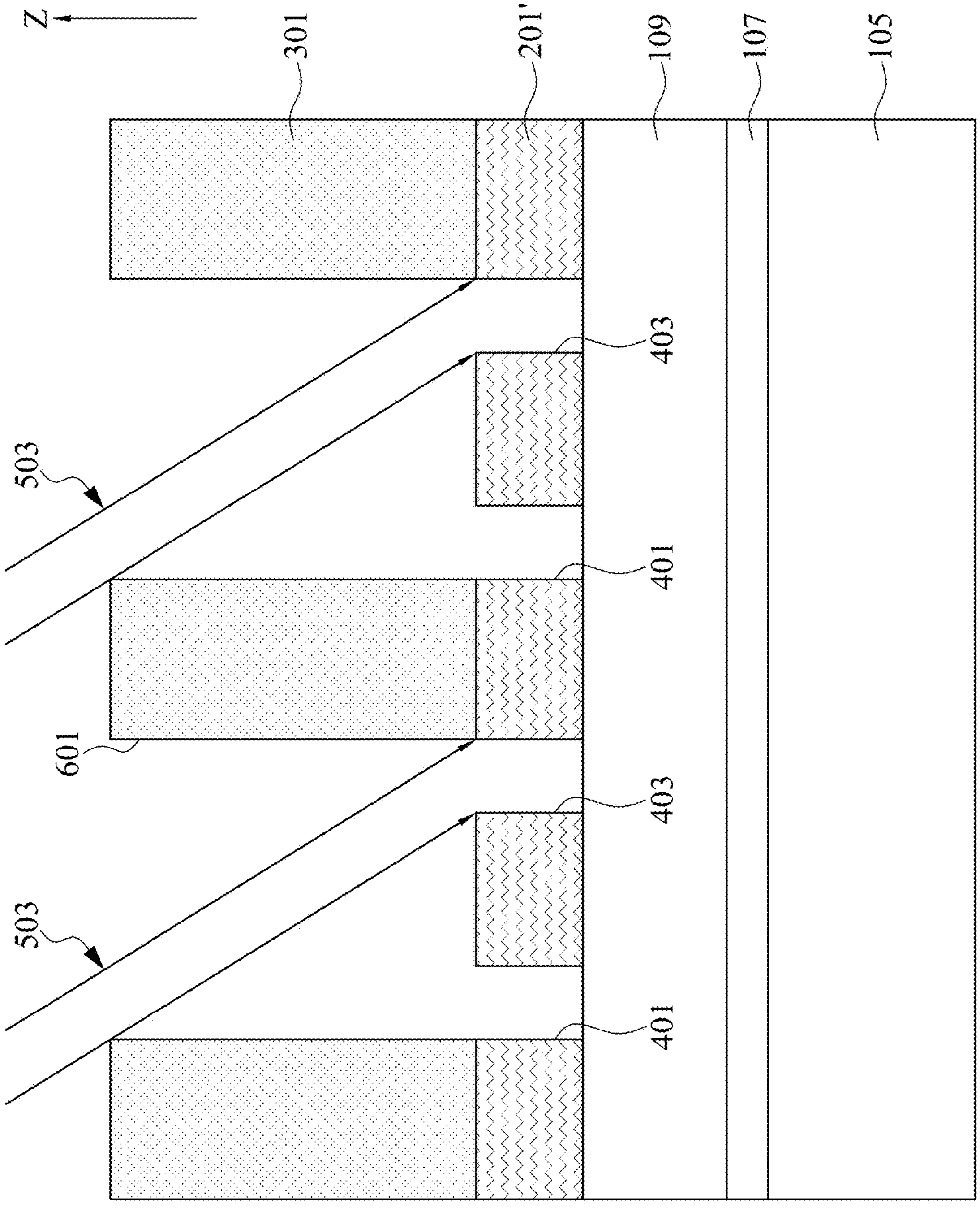

With reference to FIG. 14, a process similar to that illustrated in FIG. 4 may be performed. In some embodiments, an etch rate ratio of the first hard mask layer 201 to the topmost semiconductor layer 109 may be between about 100:1 and about 10:1 or between about 15:1 and about 10:1 during the second tilted etch process 503.

Figure 15:
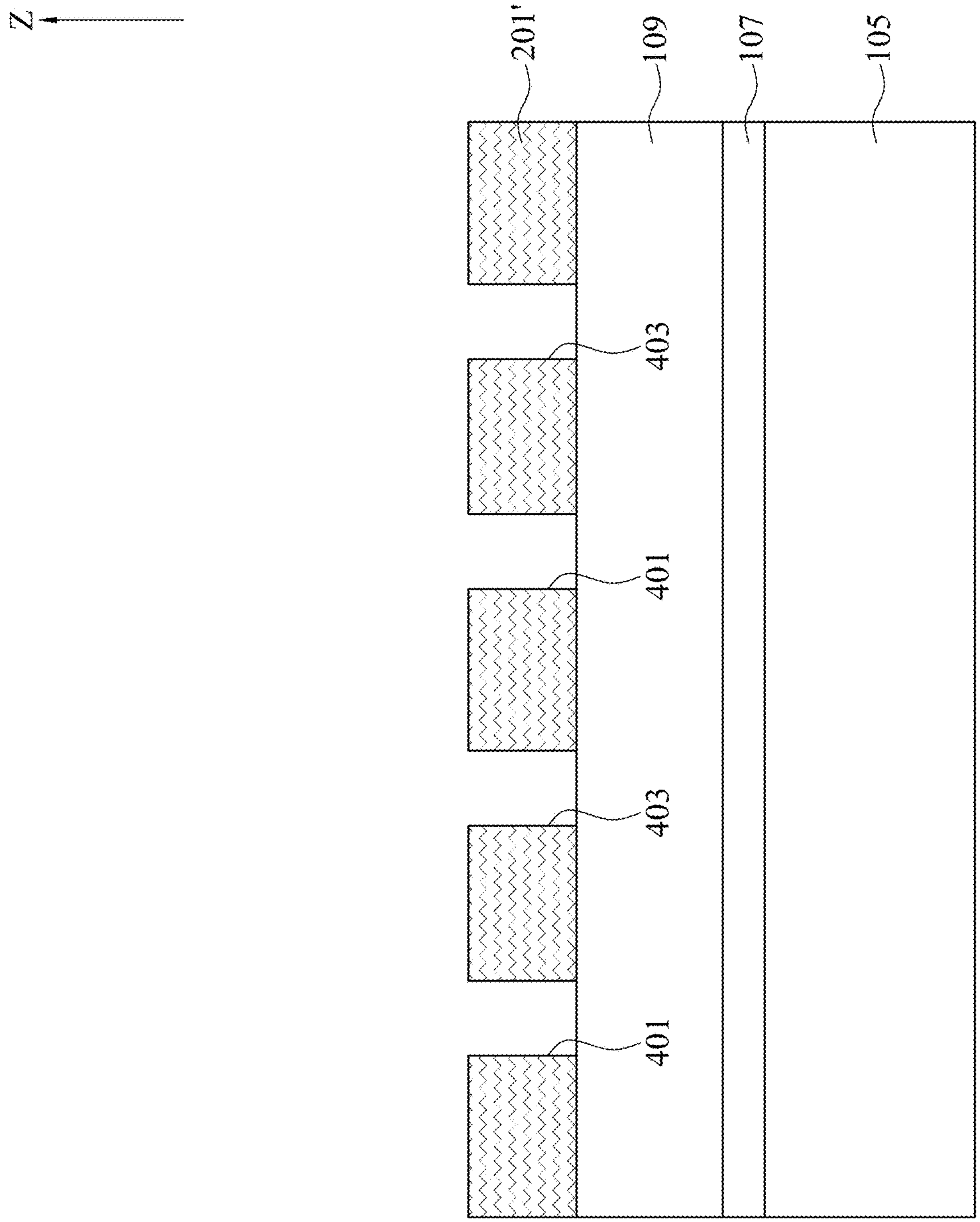

With reference to FIG. 15, a process similar to that illustrated in FIG. 5 may be performed. In some embodiments, an etch rate ratio of the second hard mask layers 301 to the topmost semiconductor layer 109 may be between about 100:1 and about 10:1 or between about 15:1 and about 10:1 during the hard mask etch process.

Figure 16:
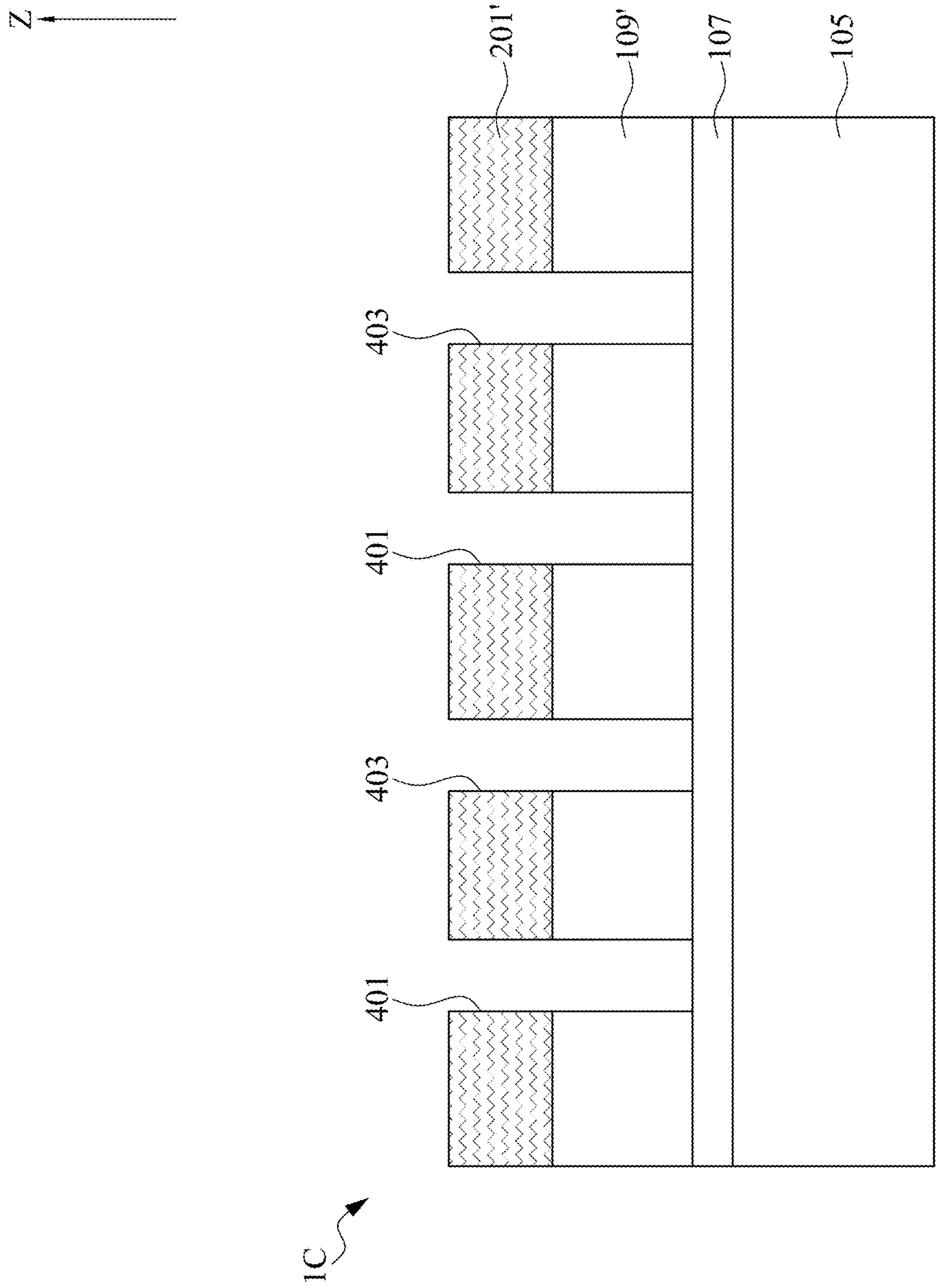

With reference to FIG. 16, a process similar to that illustrated in FIG. 6 may be performed. In some embodiments, an etch rate ratio of the topmost semiconductor layer 109 to the patterned first hard mask layer 201' may be between about 100:1 and about 10:1 or between about 15:1 and about 10:1 during the target layer etch process. In some embodiments, an etch rate ratio of the topmost semiconductor layer 109 to the insulator layer 107 may be between about 100:1 and about 10:1 or between about 15:1 and about 10:1 during the target layer etch process. After the target layer etch process, the topmost semiconductor layer 109 may be patterned into a patterned topmost semiconductor layer 109' and may be served as fin structures of the semiconductor device 1C.

FIGS. 17 to 21 illustrate, in schematic cross-sectional view diagrams, a flow for fabricating a semiconductor device 1D in accordance with another embodiment of the present disclosure.

Figure 17:
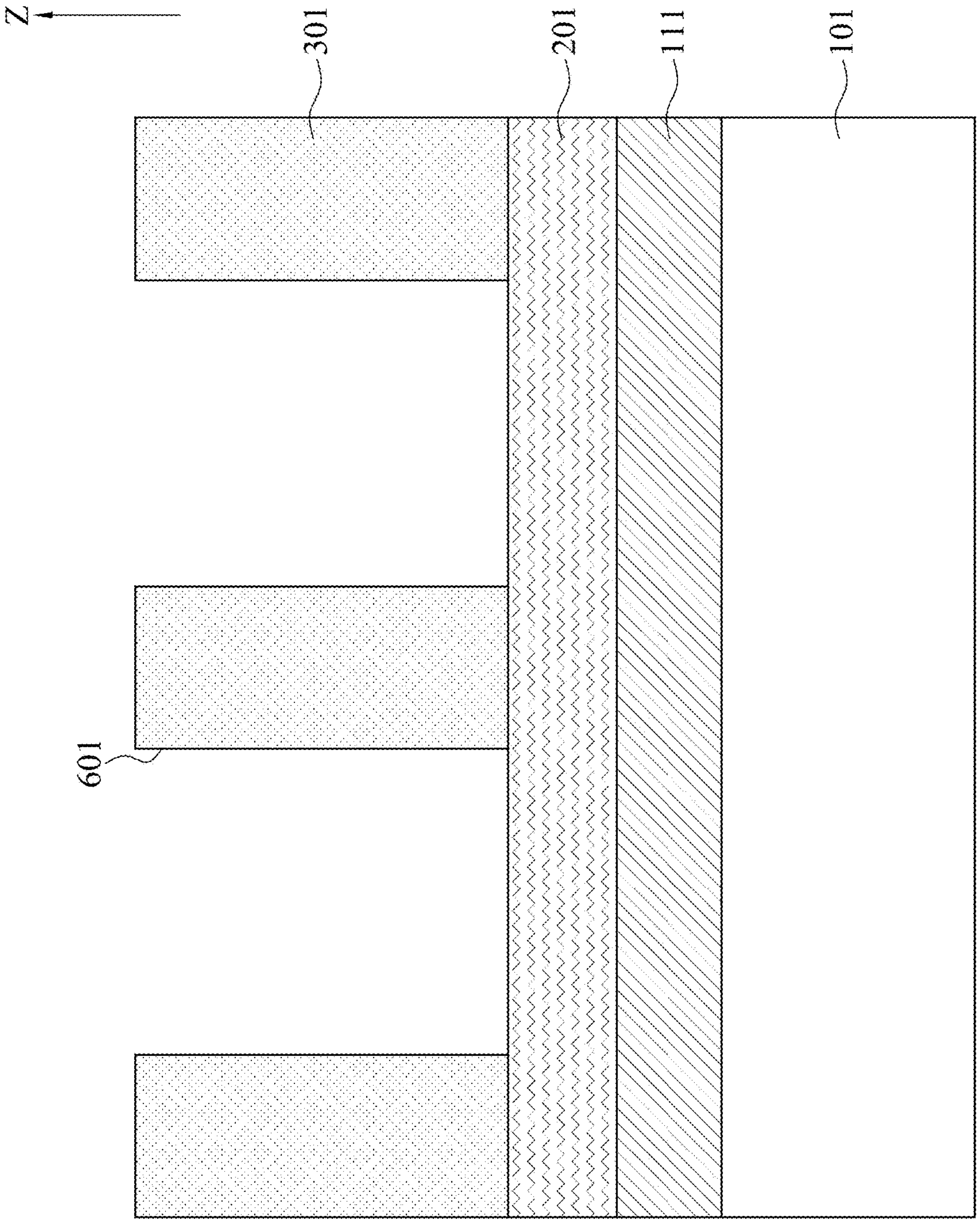
FIGS. 17 to 21 illustrate, in schematic cross-sectional view diagrams, a flow for fabricating a semiconductor device in accordance with another embodiment of the present disclosure.

With reference to FIG. 17, an intermediate semiconductor device having a similar configuration and formed by similar processing to the intermediate semiconductor device illustrated in FIG. 2 is shown. The same or similar elements in FIG. 17 as in FIG. 2 have been marked with similar reference numbers and duplicative descriptions have been omitted.

With reference to FIG. 17, a conductive layer 111 may be formed on the substrate 101 and the first hard mask layer 201 may be formed on the conductive layer 111. The substrate 101 may include dielectrics, insulating layers, or conductive features disposed on the bulk semiconductor substrate. The dielectrics or the insulating layers may be formed of, for example, silicon oxide, silicon nitride, silicon oxynitride, silicon nitride oxide, borophosphosilicate glass, undoped silicate glass, fluorinated silicate glass, low-k dielectric materials, the like, or a combination thereof. Each of the dielectrics or each of the insulating layers may have a thickness between about 0.5 micrometer and about 3.0 micrometer. The low-k dielectric materials may have a dielectric constant less than 3.0 or even less than 2.5. The conductive features may be conductive lines, conductive vias, conductive contacts, or the like. The conductive layer 111 may be formed of, for example, copper, aluminum, titanium, tungsten, the like, or a combination thereof.

Figure 18:
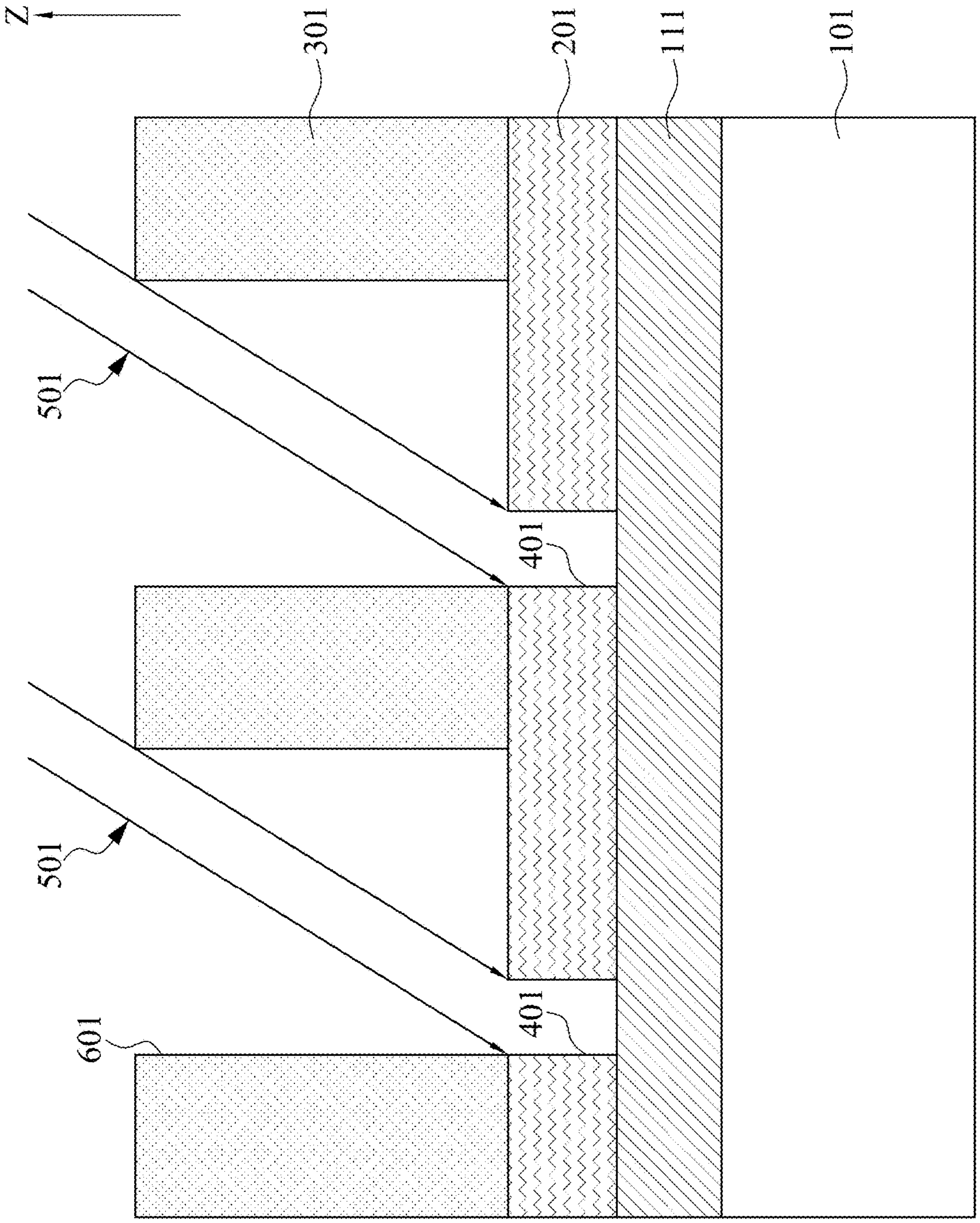

With reference to FIG. 18, a process similar to that illustrated in FIG. 3 may be performed. In some embodiments, an etch rate ratio of the first hard mask layer 201 to conductive layer 111 may be between about 100:1 and about 10:1 or between about 15:1 and about 10:1 during the first tilted etch process 501.

Figure 19:
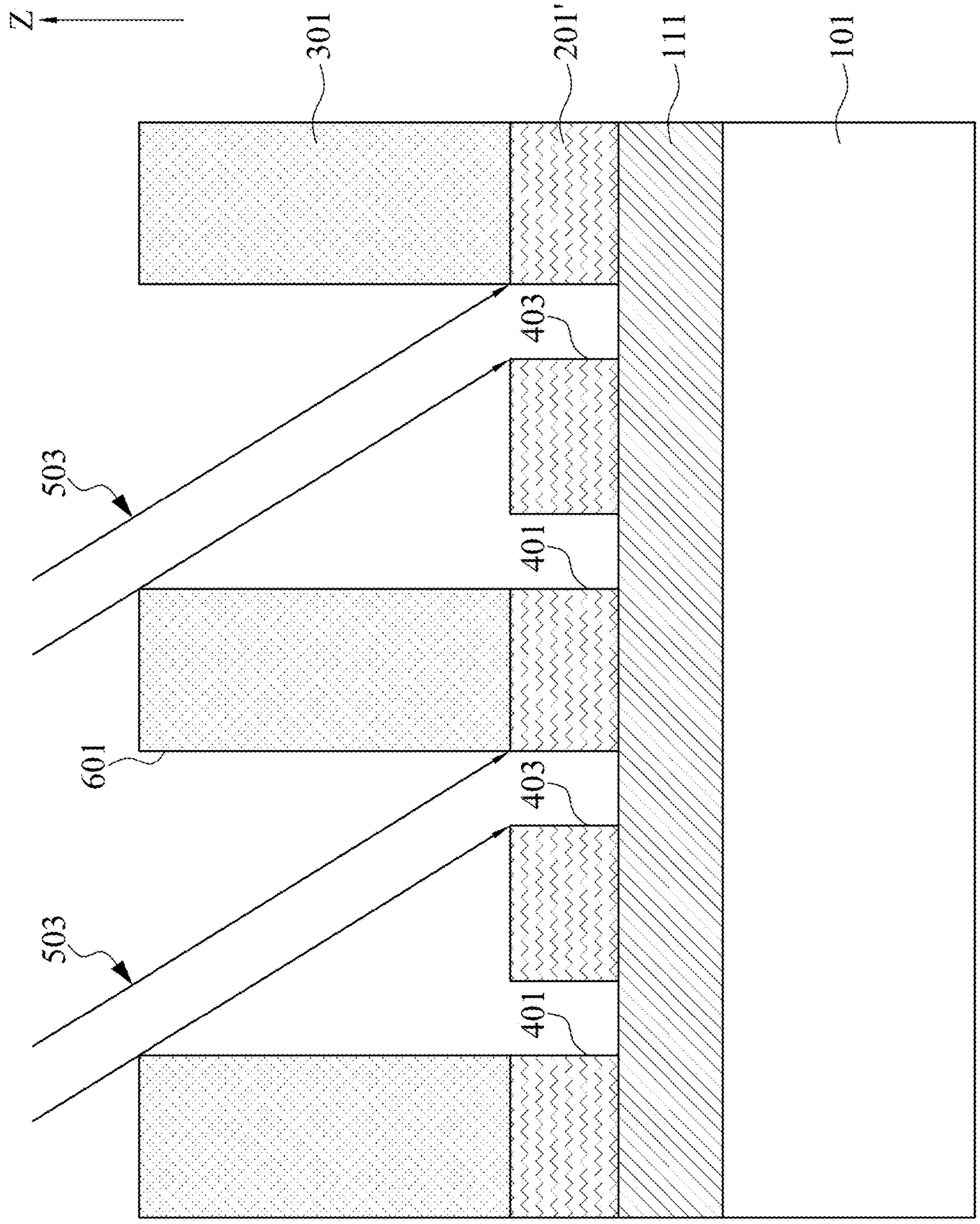

With reference to FIG. 19, a process similar to that illustrated in FIG. 4 may be performed. In some embodiments, an etch rate ratio of the first hard mask layer 201 to the conductive layer 111 may be between about 100:1 and about 10:1 or between about 15:1 and about 10:1 during the second tilted etch process 503.

Figure 20:
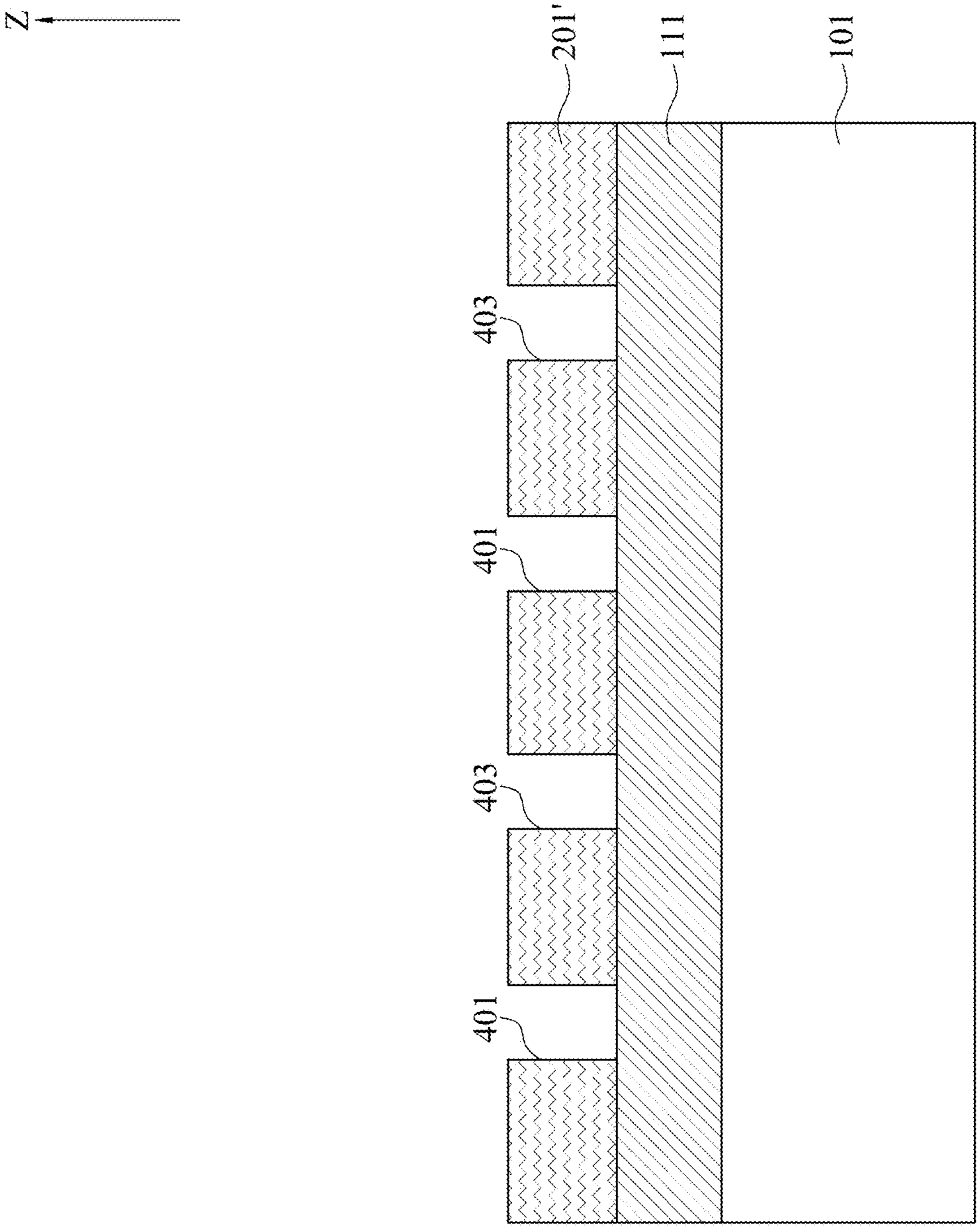

With reference to FIG. 20, a process similar to that illustrated in FIG. 5 may be performed. In some embodiments, an etch rate ratio of the second hard mask layers 301 to the conductive layer 111 may be between about 100:1 and about 10:1 or between about 15:1 and about 10:1 during the hard mask etch process.

Figure 21:
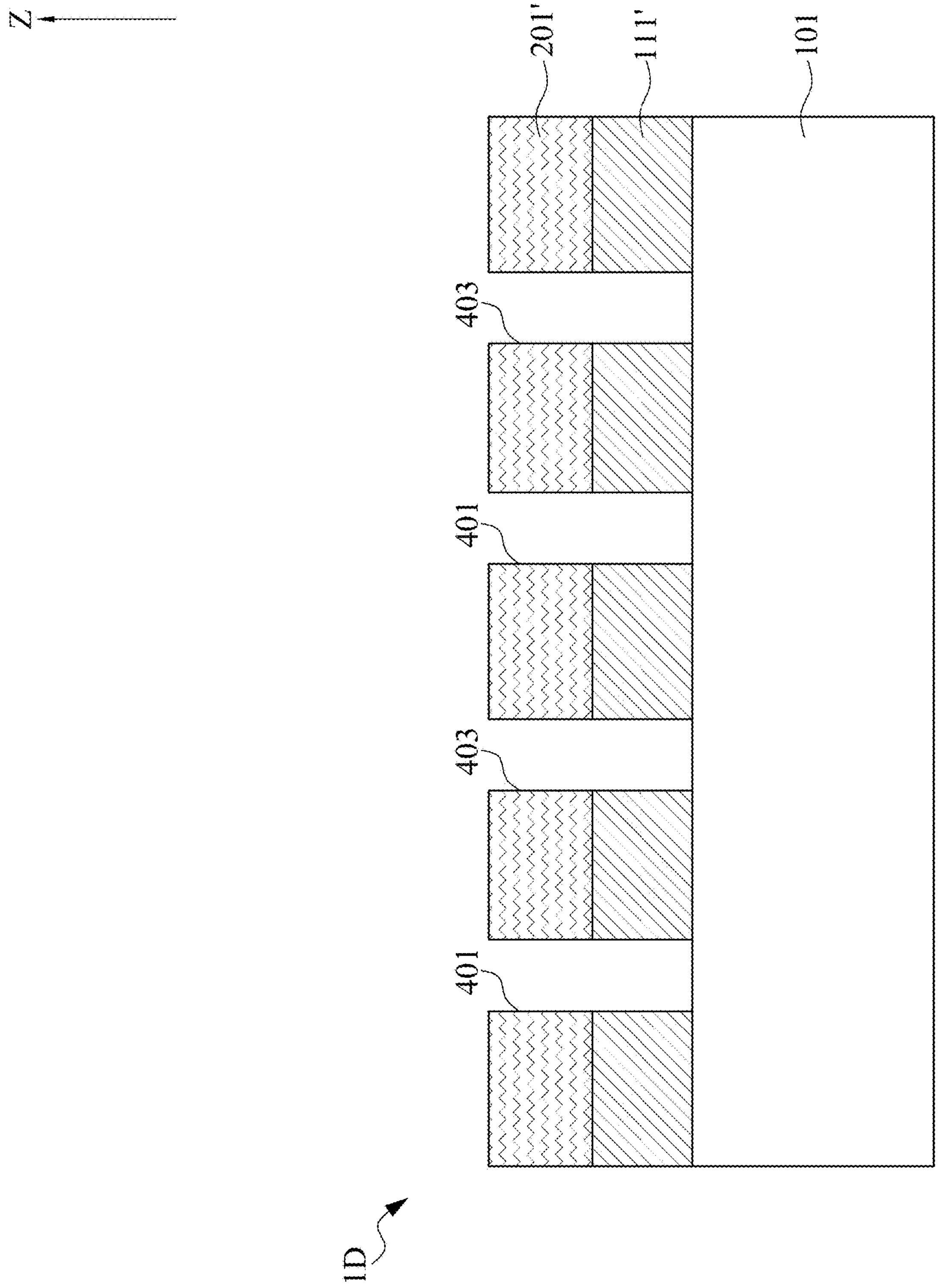

With reference to FIG. 21, a process similar to that illustrated in FIG. 6 may be performed. In some embodiments, an etch rate ratio of the conductive layer 111 to the patterned first hard mask layer 201' may be between about 100:1 and about 10:1 or between about 15:1 and about 10:1 during the target layer etch process. After the target layer etch process, the conductive layer 111 may be patterned into a patterned conductive layer 111' and may be served as conductive lines of the semiconductor device 1D.

FIGS. 22 to 26 illustrate, in schematic cross-sectional view diagrams, a flow for fabricating a semiconductor device 1E in accordance with another embodiment of the present disclosure.

Figure 22:
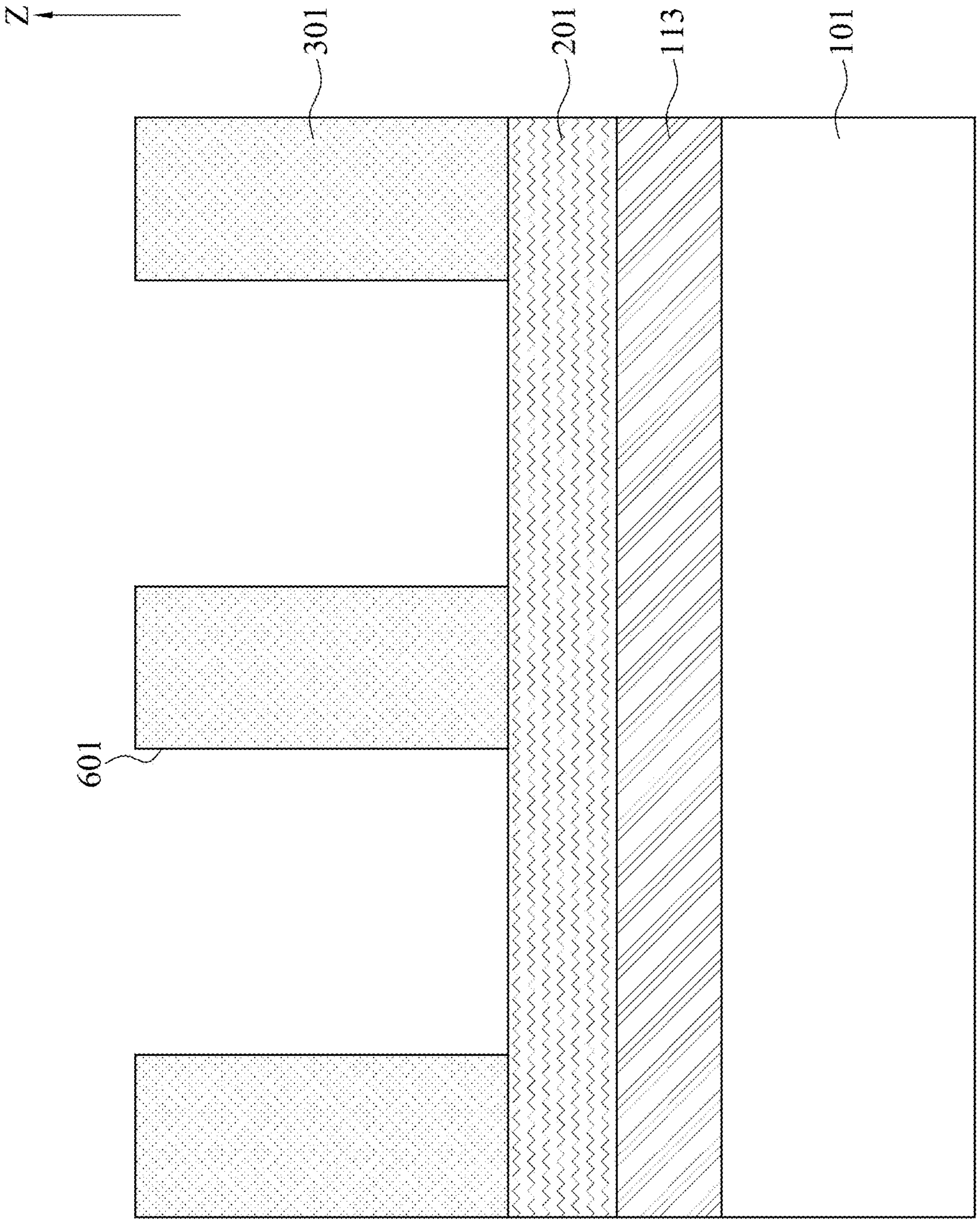
FIGS. 22 to 26 illustrate, in schematic cross-sectional view diagrams, a flow for fabricating a semiconductor device in accordance with another embodiment of the present disclosure.

With reference to FIG. 22, an intermediate semiconductor device having a similar configuration and formed by similar processing to the intermediate semiconductor device illustrated in FIG. 2 is shown. The same or similar elements in FIG. 22 as in FIG. 2 have been marked with similar reference numbers and duplicative descriptions have been omitted.

With reference to FIG. 22, a dielectric layer 113 may be formed on the substrate 101 and the first hard mask layer 201 may be formed on the dielectric layer 113. The dielectric layer 113 may be formed of, for example, silicon oxide, silicon nitride, silicon oxynitride, silicon nitride oxide, borophosphosilicate glass, undoped silicate glass, fluorinated silicate glass, low-k dielectric materials, the like, or a combination thereof.

Figure 23:
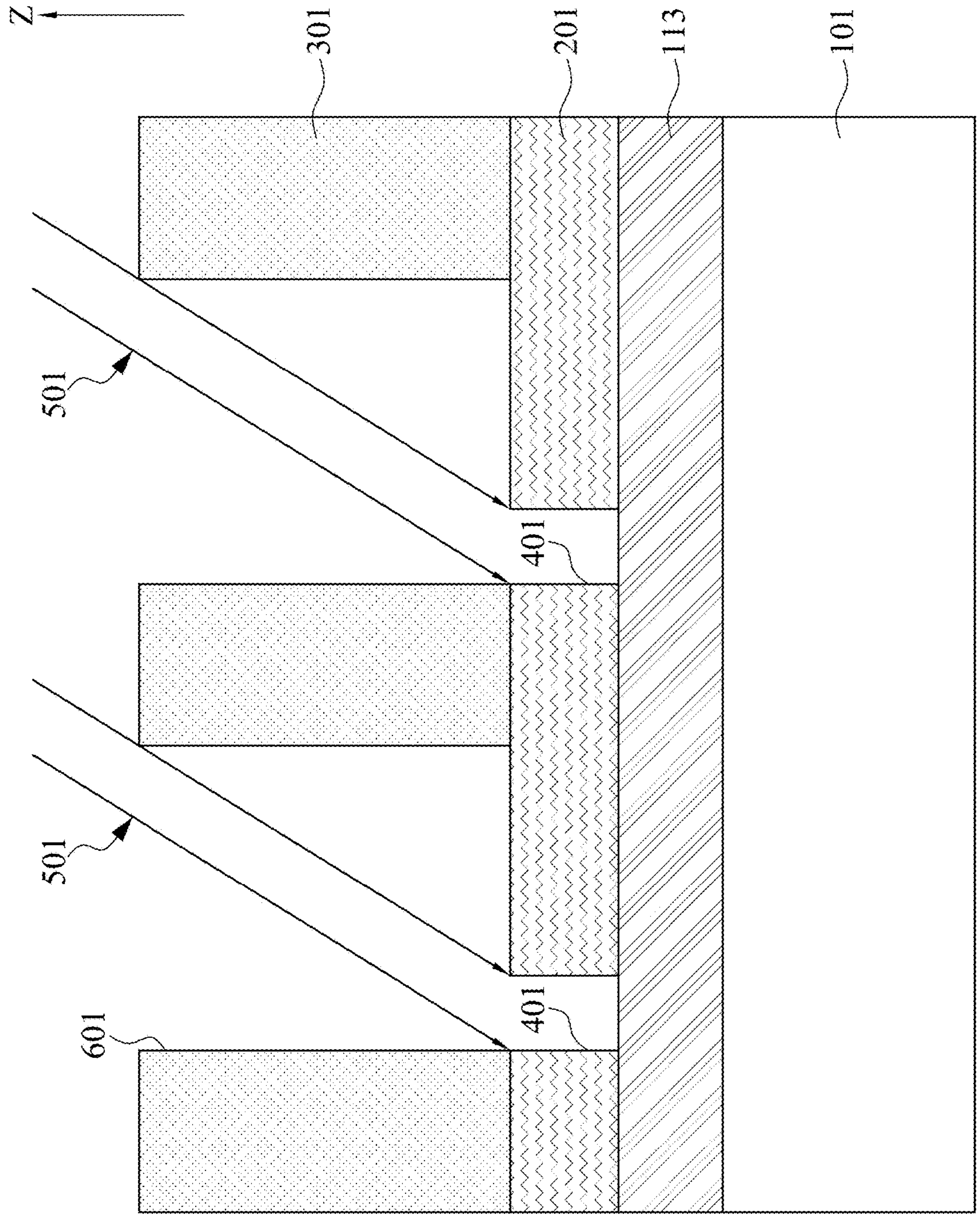

With reference to FIG. 23, a process similar to that illustrated in FIG. 3 may be performed. In some embodiments, an etch rate ratio of the first hard mask layer 201 to the dielectric layer 113 may be between about 100:1 and about 10:1 or between about 15:1 and about 10:1 during the first tilted etch process 501.

Figure 24:
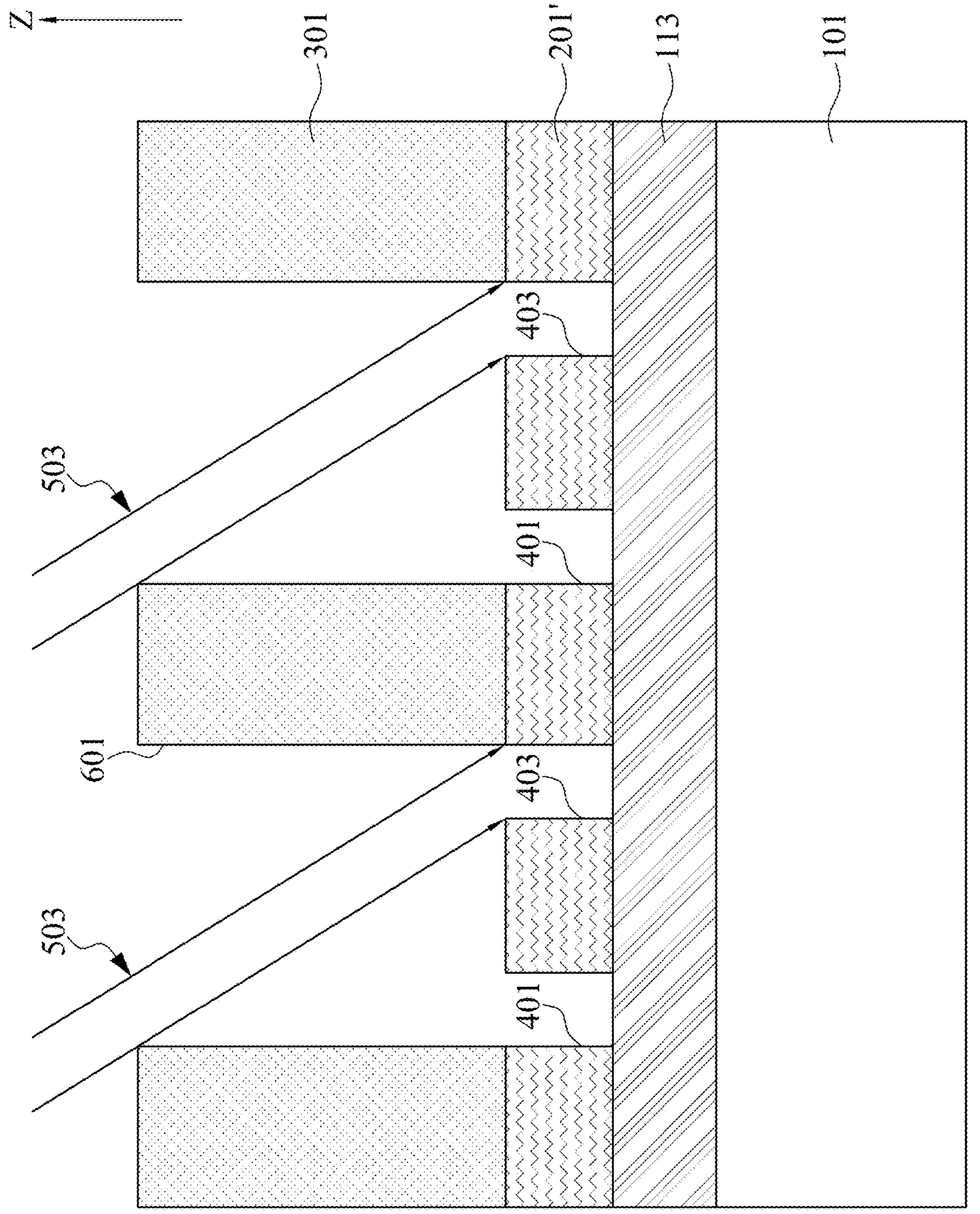

With reference to FIG. 24, a process similar to that illustrated in FIG. 4 may be performed. In some embodiments, an etch rate ratio of the first hard mask layer 201 to the dielectric layer 113 may be between about 100:1 and about 10:1 or between about 15:1 and about 10:1 during the second tilted etch process 503.

Figure 25:
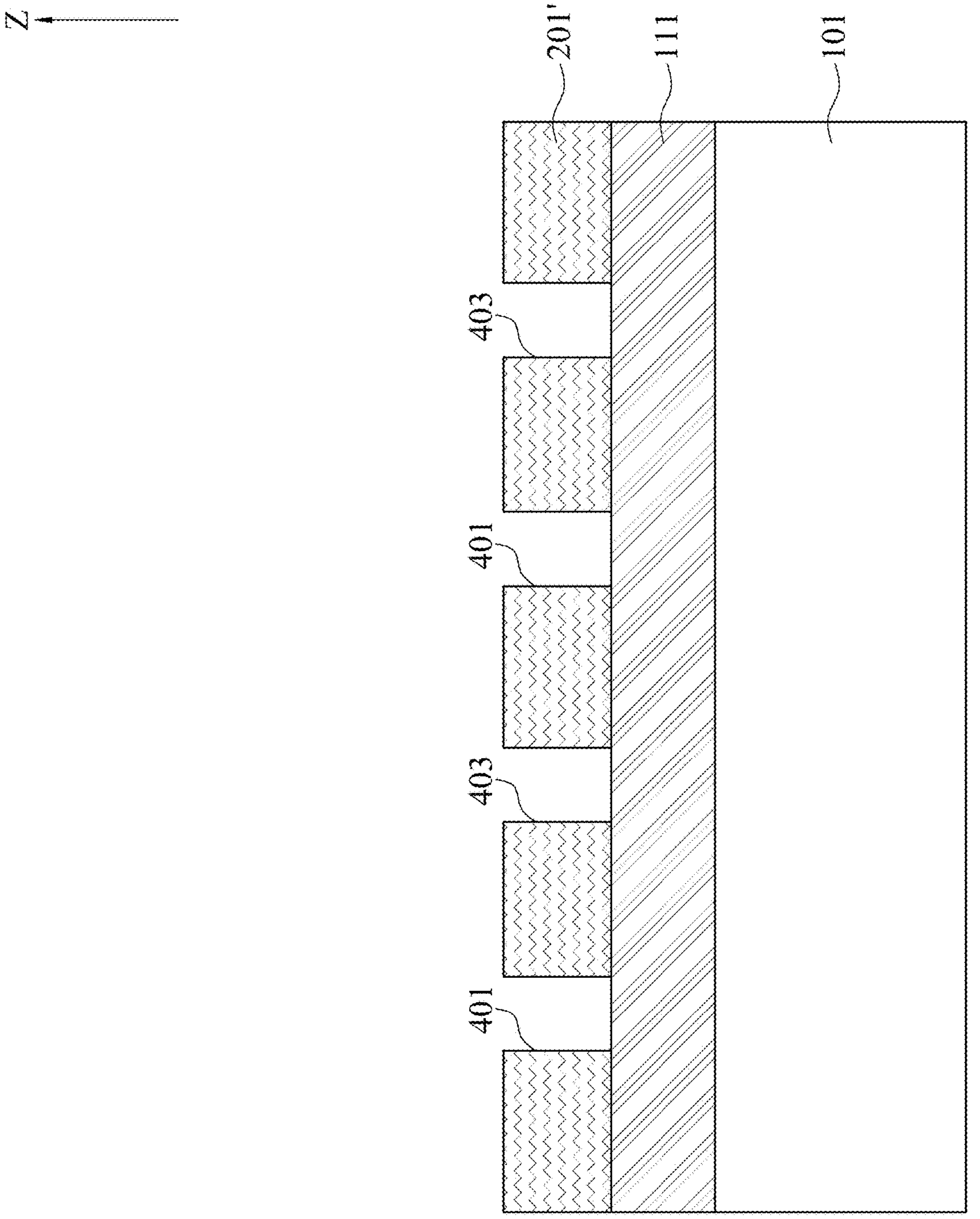

With reference to FIG. 25, a process similar to that illustrated in FIG. 5 may be performed. In some embodiments, an etch rate ratio of the second hard mask layers 301 to the dielectric layer 113 may be between about 100:1 and about 10:1 or between about 15:1 and about 10:1 during the hard mask etch process.

Figure 26:
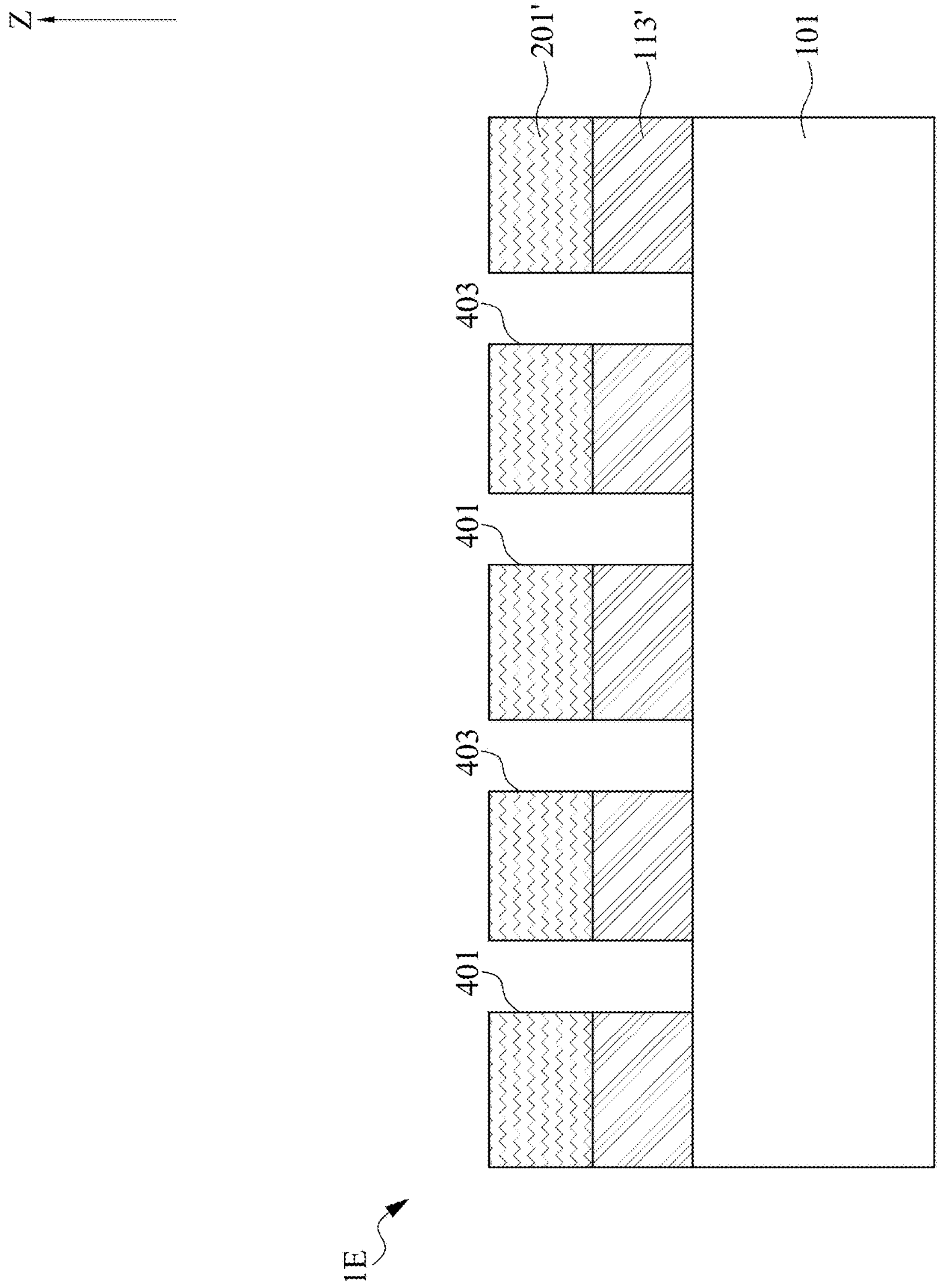

With reference to FIG. 26, a process similar to that illustrated in FIG. 6 may be performed. In some embodiments, an etch rate ratio of the dielectric layer 113 to the patterned first hard mask layer 201' may be between about 100:1 and about 10:1 or between about 15:1 and about 10:1 during the target layer etch process. After the target layer etch process, the dielectric layer 113 may be patterned into a patterned dielectric layer 113'. A conductive material may be deposited over the patterned dielectric layer 113' and a planarization process, such as chemical mechanical polishing, may be subsequently performed to form conductive features of the semiconductor device 1E in the patterned dielectric layer 113'.

Figure 27:
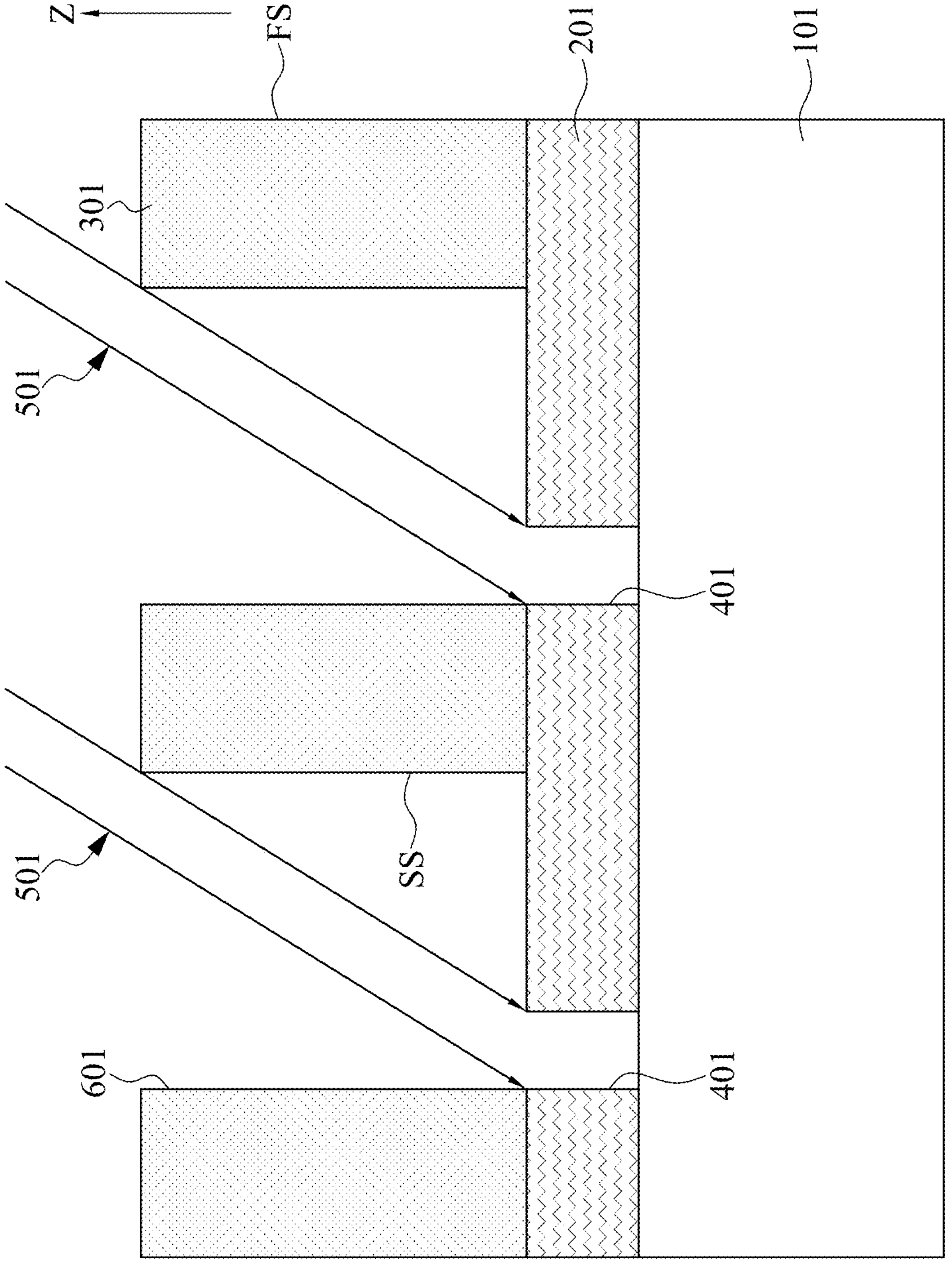
FIGS. 27 and 28 illustrate, in schematic cross-sectional view diagrams, a flow for fabricating a semiconductor device in accordance with another embodiment of the present disclosure.
Figure 28:
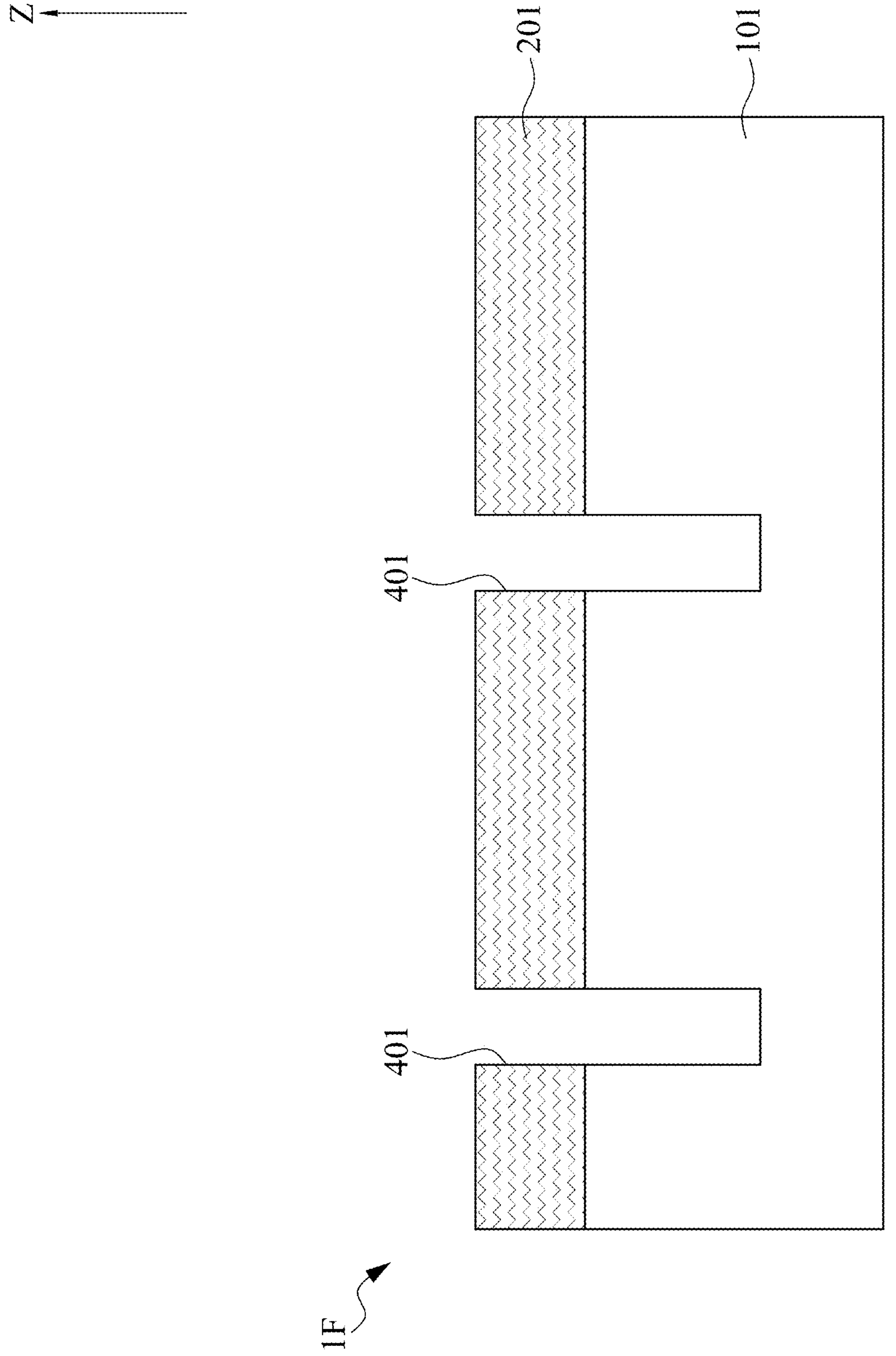

FIGS. 27 and 28 illustrate, in schematic cross-sectional view diagrams, a flow for fabricating a semiconductor device 1F in accordance with another embodiment of the present disclosure.

With reference to FIG. 27, an intermediate semiconductor device and a process similar to that illustrated in FIG. 3 may be provided and performed. With reference to FIG. 28, the second hard mask layers 301 may be removed with a procedure similar to that illustrated in FIG. 5 and the substrate 101 may be patterned using the first hard mask layer 201 having the first openings 401 as a mask employing a procedure similar to that illustrated in FIG. 6. After the target layer etch process, the substrate 101 may be turned into the patterned first substrate 101'. It should be noted that only the first tilted etch process 501 is performed in the embodiment.

Figure 29:
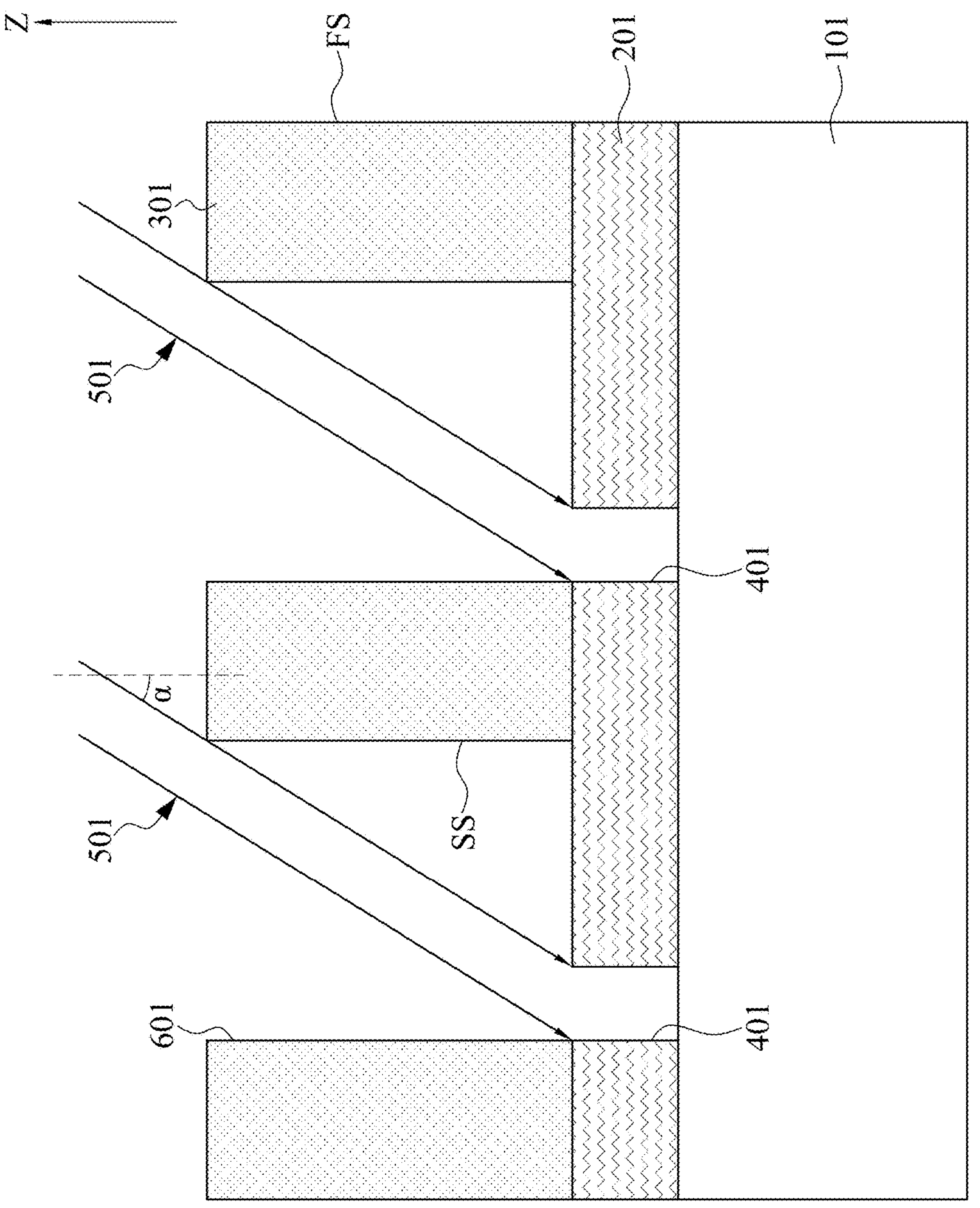
FIGS. 29 to 31 illustrate, in schematic cross-sectional view diagrams, a flow for fabricating a semiconductor device in accordance with another embodiment of the present disclosure.
Figure 30:
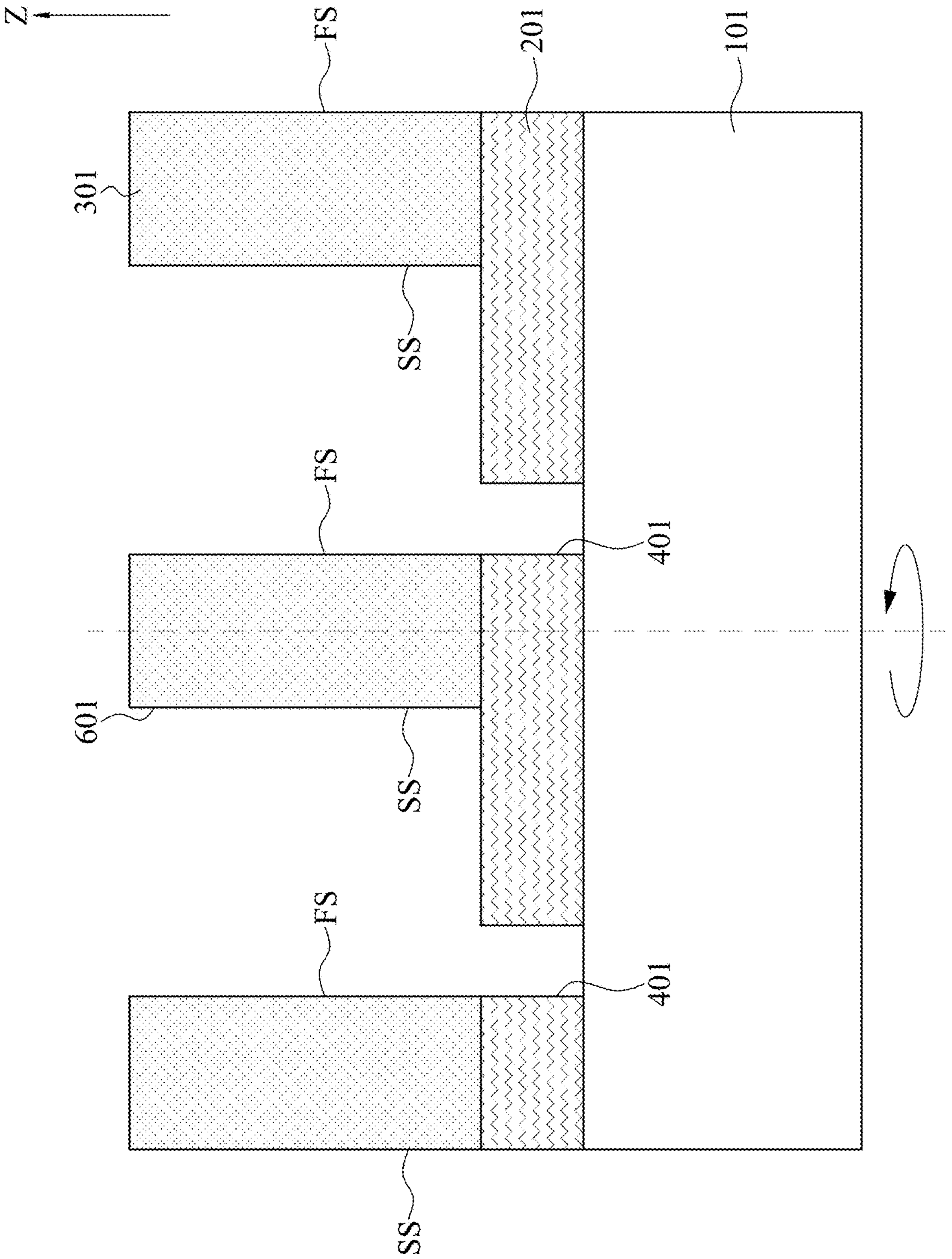
Figure 31:
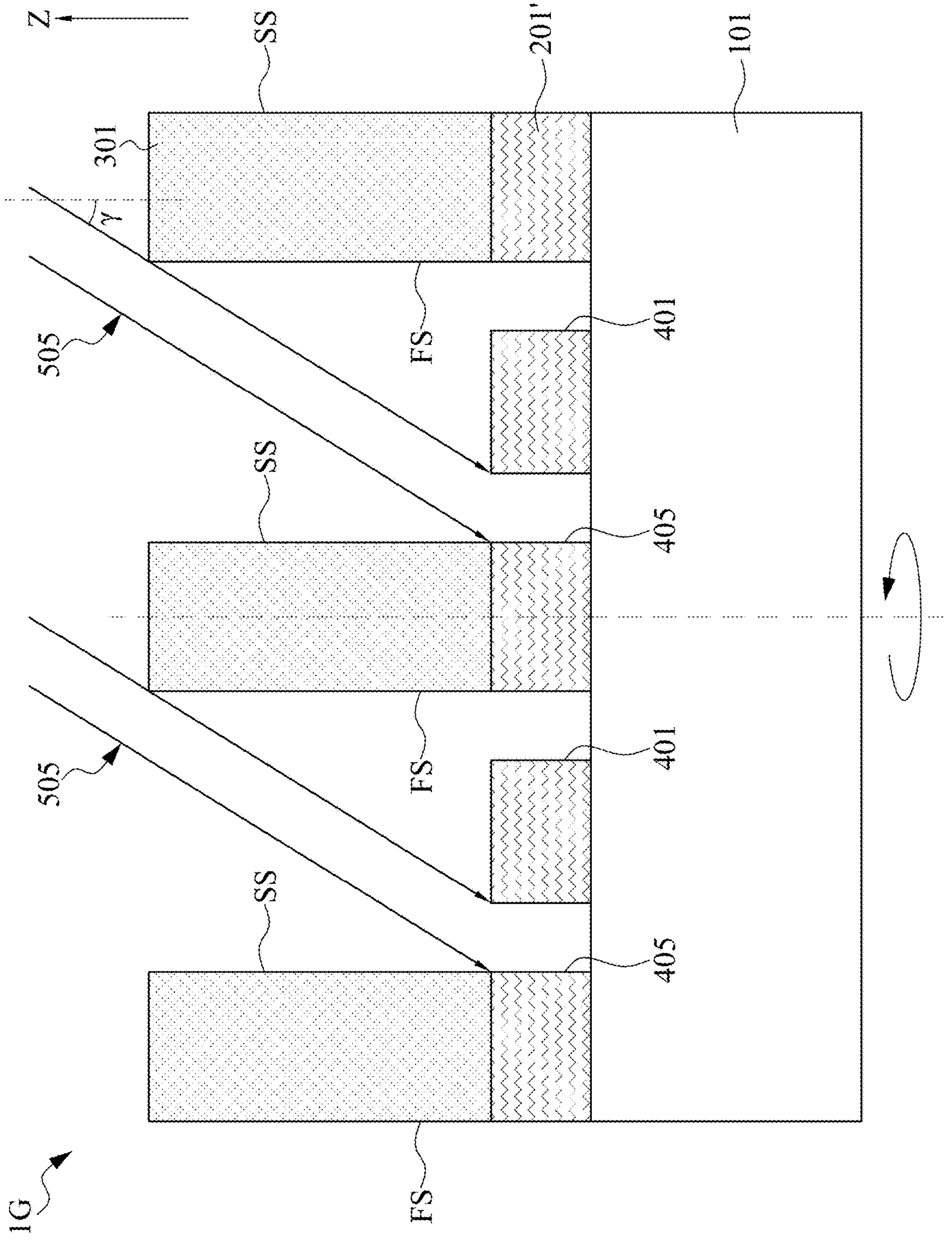

FIGS. 29 to 31 illustrate, in schematic cross-sectional view diagrams, a flow for fabricating a semiconductor device 1G in accordance with another embodiment of the present disclosure.

With reference to FIG. 29, an intermediate semiconductor device and a process similar to that illustrated in FIG. 3 may be provided and performed. With reference to FIG. 30, a 180 degree rotation may be performed to the intermediate semiconductor device by rotating the substrate 101.

With reference to FIG. 31, a third tilted etch process 505 may be performed on the first hard mask layer 201 to formed third openings 405 along the first hard mask layer 201 and adjacent to the second sides of the second hard mask layers 301. The third tilted etch process 505 may have same parameters as the first tilted etch process 501. For example, the angle of incidence $\gamma$ of the third tilted etch process 505 may be the same as the angle of incidence $\alpha$ of the first tilted etch process 501. The dimension of the third openings 405 may be the same as the dimension of the first openings 401. The first hard mask layer 201 may be patterned by the first openings 401 and the third openings 405.

By rotating the intermediate semiconductor device, the setting of the equipment performing the first tilted etch process 501 may be continued to use to perform the third tilted etch process 505. The deviations of changing equipment settings (e.g., the angle of incidence) may be reduced. As a result, the quality of the semiconductor device 1G may be improved.

Figure 32:
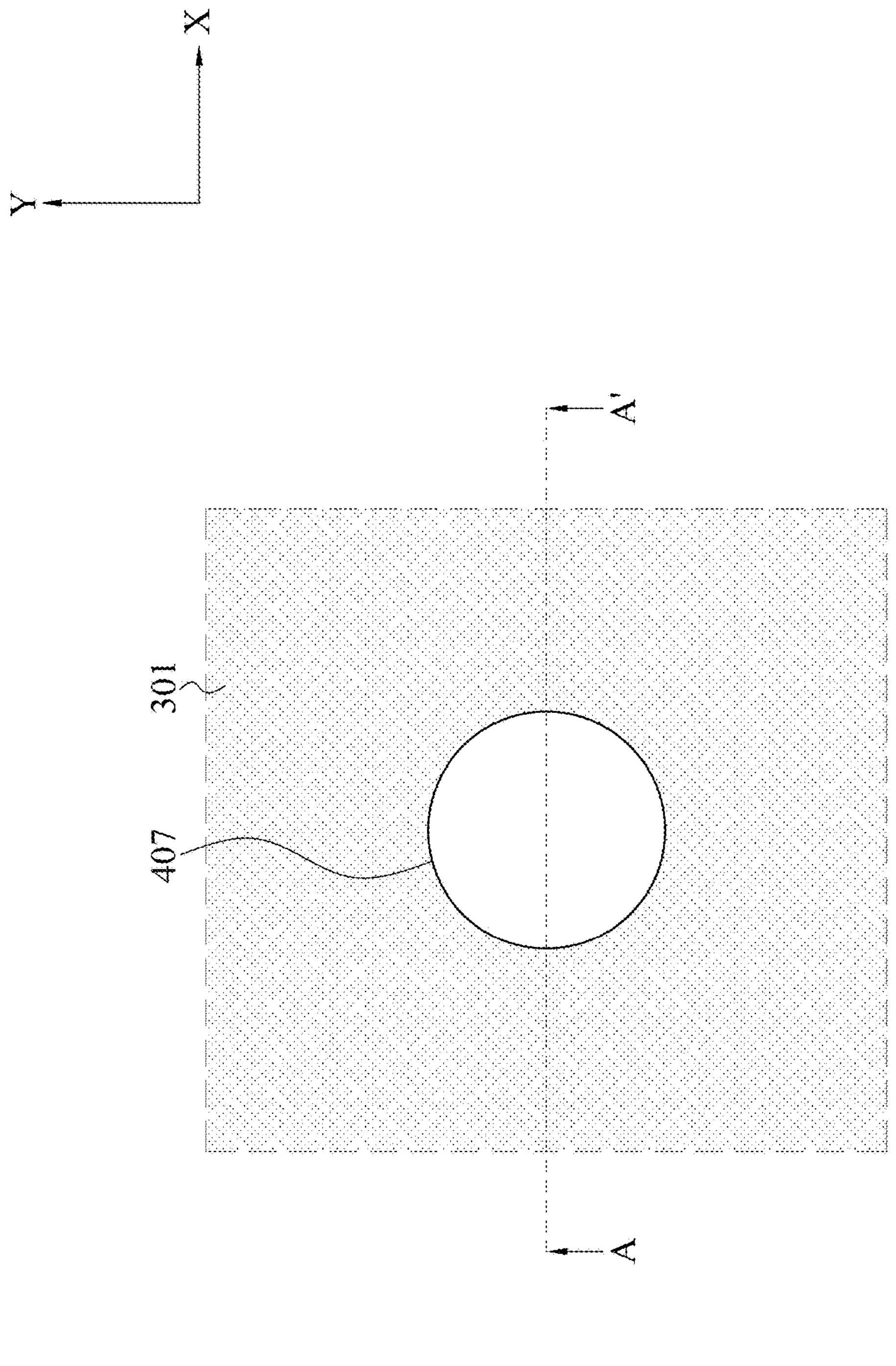
FIG. 32 illustrates, in a schematic top-view diagram, an intermediate semiconductor device in accordance with another embodiment of the present disclosure.
Figure 33:
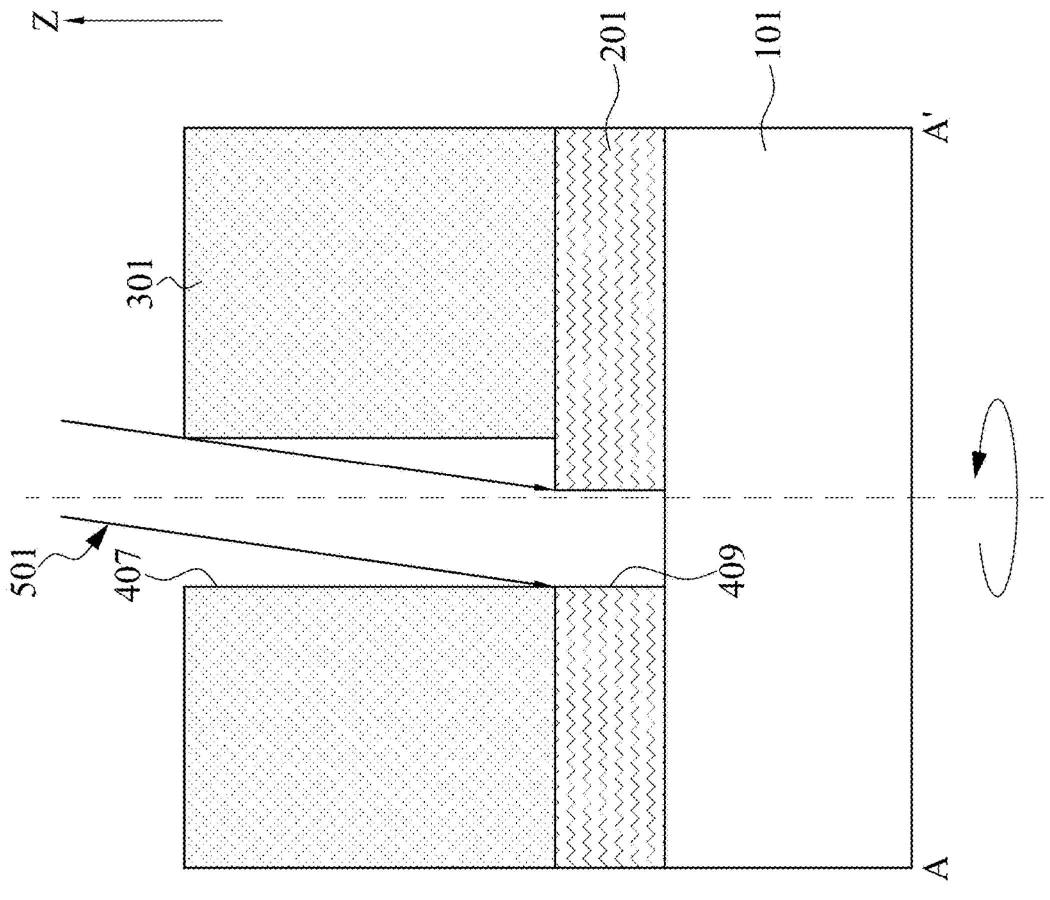
FIG. 33 is a schematic cross-sectional view diagram taken along a line A-A' in FIG. 32 and is part of a flow for fabricating a semiconductor device in accordance with another embodiment of the present disclosure.
Figure 34:
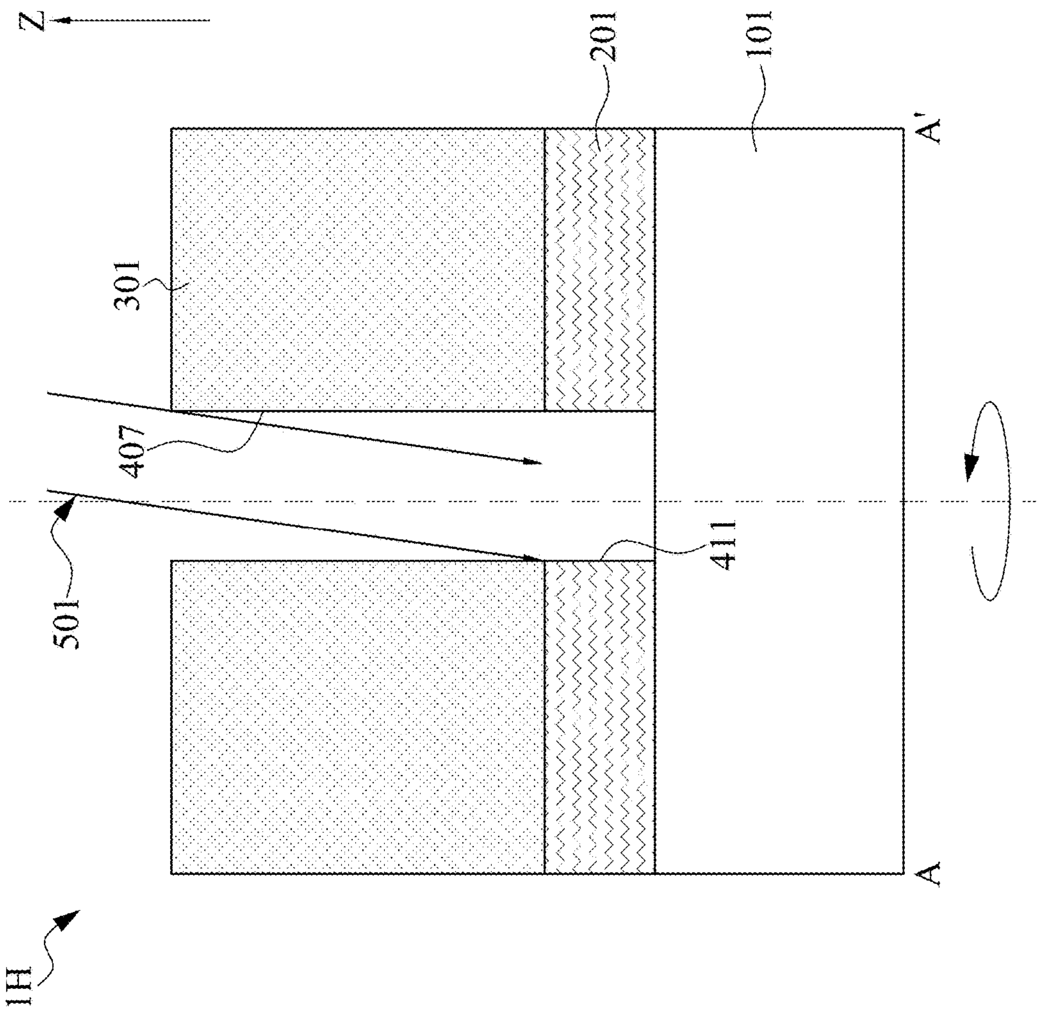
FIG. 34 is part of the flow for fabricating the semiconductor device in accordance with another embodiment of the present disclosure.

FIG. 32 illustrates, in a schematic top-view diagram, an intermediate semiconductor device in accordance with another embodiment of the present disclosure. FIG. 33 is a schematic cross-sectional view diagram taken along a line A-A' in FIG. 32 and is part of a flow for fabricating a semiconductor device 1H in accordance with another embodiment of the present disclosure. FIG. 34 is part of the flow for fabricating the semiconductor device 1H in accordance with another embodiment of the present disclosure.

With reference to FIGS. 33 and 34, the space between the second hard mask layers 301 may be referred to as a first contact opening 407. The first contact opening 407 may have a circular shape in a top-view perspective. The first tilted etch process 501 may be performed using the second hard mask layers 301 as pattern guides to remove a portion of the first hard mask layer 201 to form an intermediate contact opening 409 therein. While performing the first tilted etch process 501, a 360 degree rotation may be performed to the intermediate semiconductor device by rotating the substrate 101.

With reference to FIG. 33, other portions of the first hard mask layer 201 may be also removed through the first tilted etch process 501 by the rotation. The intermediate contact opening 409 may be expanded to a second contact opening 411. A conductive material such as tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof may be filled in the second contact opening 411 to form a conductive contact of the semiconductor device 1H.

Due to the design of the semiconductor device of the present disclosure, the first openings 401 and the second openings 403 may be formed without additional photolithography process on the first hard mask layer 201 by using he first tilted etch process 501 and the second tilted etch process 503. Hence, the complexity of fabrication of the semiconductor device 1A may be reduced. In addition, the narrower first openings 401 and the narrower second openings 403 may be formed using second hard mask layers 301 having wider hard mask openings 601. That is, the requirements of photolithography process for forming the narrower first openings 401 and the second openings 403 may be alleviated. As a result, the yield of the semiconductor device 1A may be improved.

Figure 38:
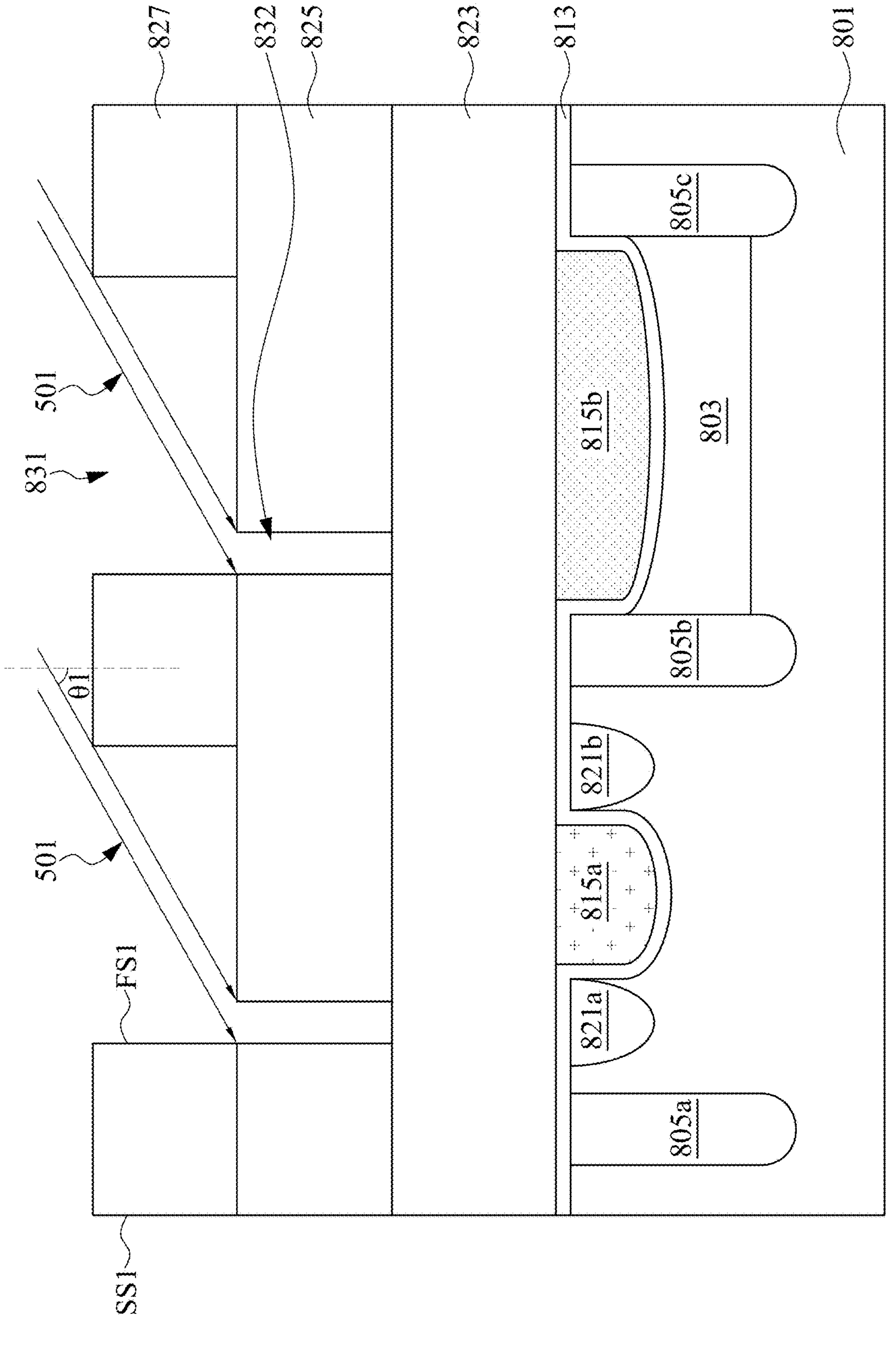
Figure 39:
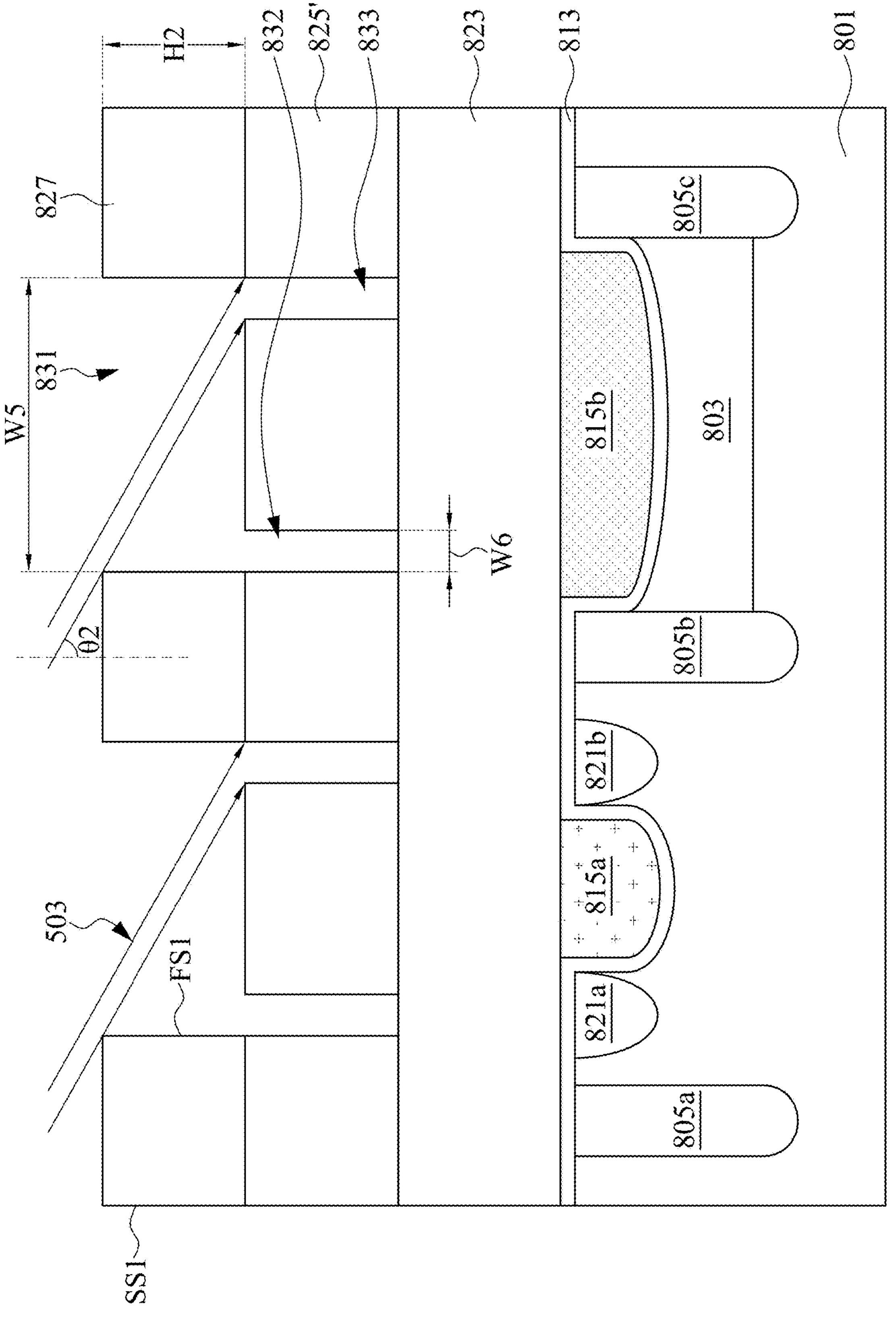
Figure 40:
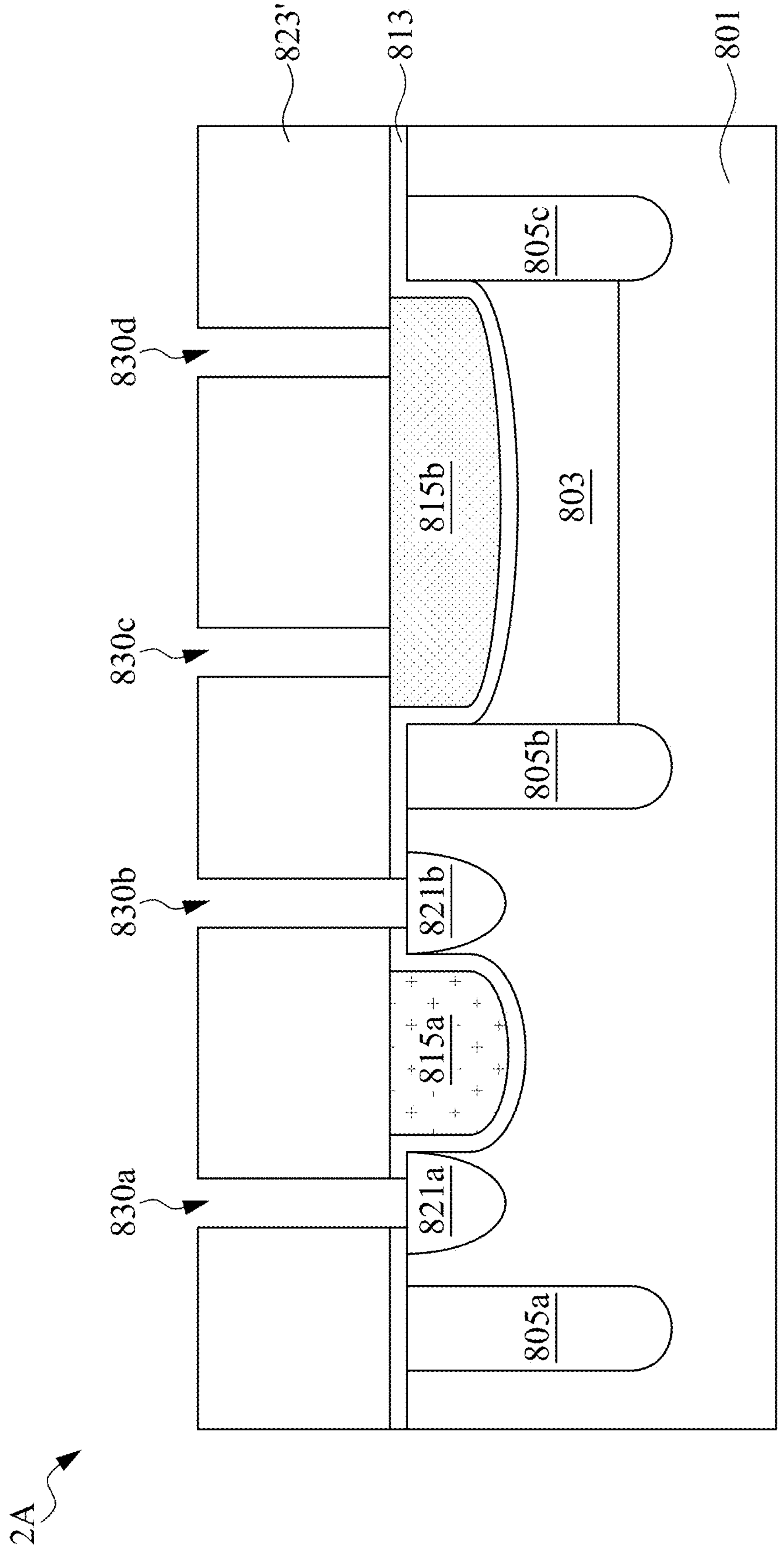
FIG. 40 illustrates a schematic of a semiconductor device in accordance with some embodiments of the present disclosure

Reference is made to FIG. 35 to FIG. 40. FIG. 40 is a cross-sectional view illustrating a semiconductor device 2A in accordance with one embodiment of the present disclosure; and FIG. 35 to FIG. 39 are cross-sectional view diagrams illustrating a flow for fabricating the semiconductor device 2A in accordance with one embodiment of the present disclosure. In some embodiments, a part of the method 10 for fabricating the semiconductor device 1A can be applied to fabricate the semiconductor device 2A.

Figure 35:
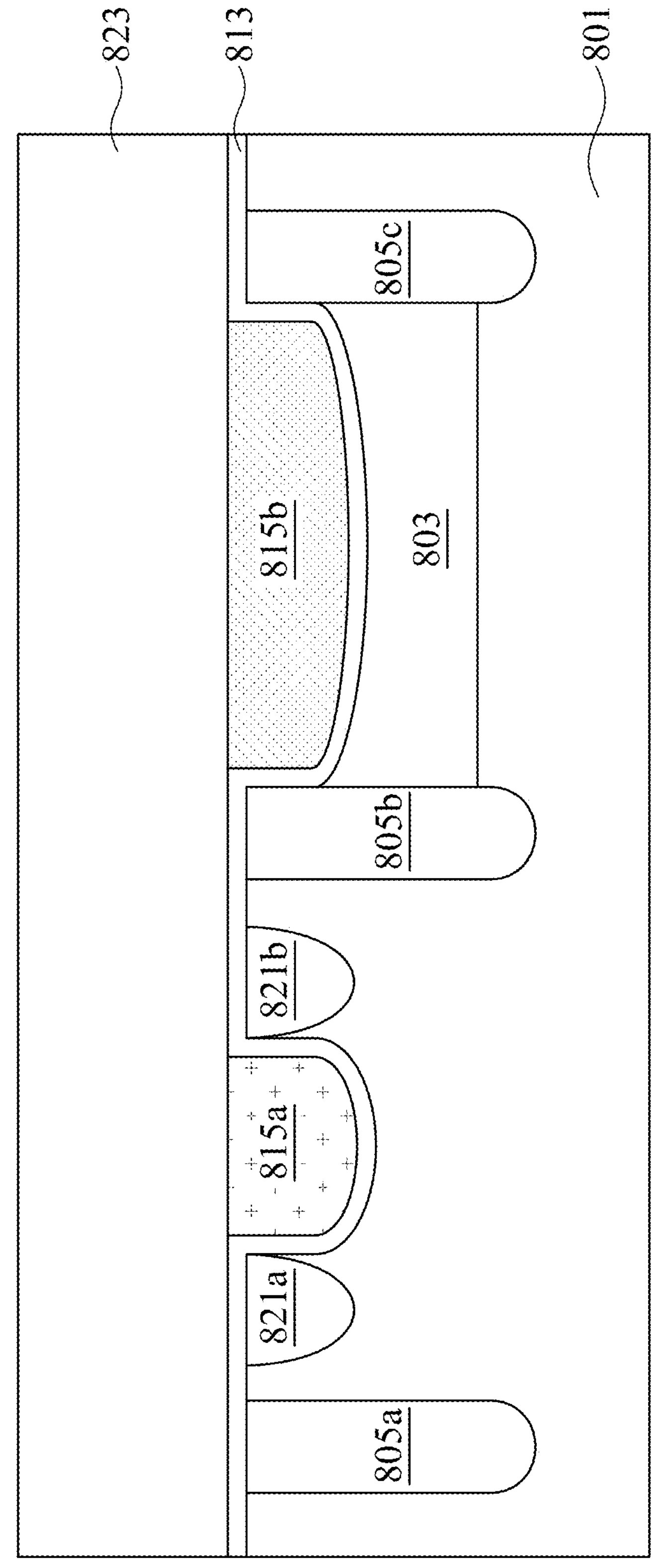
FIGS. 35 to 39 illustrate, in schematic cross-sectional view diagrams, a flow for fabricating a semiconductor device in accordance with some embodiments of the present disclosure.

In FIG. 35, a semiconductor substrate 801 is provided. The semiconductor substrate 801 may be a semiconductor wafer such as a silicon wafer. In some embodiments, the semiconductor substrate 801 includes the same materials as the semiconductor substrate 101. Isolation structures 805*a*, 805*b*, 805*c* are formed in the semiconductor substrate 801, and a well region 803 is formed between the isolation structures 805*b* and 805*c*, in accordance with some embodiments. In some embodiments, the isolation structures 805*a*, 805*b* and 805*c* are shallow trench isolation (STI) structures. In addition, the isolation structures 805*a*, 805*b* and 805*c* may be made of silicon oxide, silicon nitride, silicon oxynitride or another applicable dielectric material, and the formation of the isolation structures 805*a*, 805*b* and 805*c* may include forming a patterned mask (not shown) over the semiconductor substrate 801, etching the semiconductor substrate 801 to form openings (not shown) by using the patterned mask as a mask, depositing a dielectric material in the openings and over the semiconductor substrate 801, and polishing the dielectric material until the semiconductor substrate 801 is exposed.

The well region 803 is formed by an ion implantation process, and P-type dopants, such as boron (B), gallium (Ga), or indium (In), or N-type dopants, such as phosphorous (P) or arsenic (As), can be implanted in the portion of the semiconductor substrate 801 between the isolation structures 805*b* and 805*c* to form the well region 803 (The ion implantation process may be performed by using a patterned mask covering the portion of the semiconductor substrate 801 between the isolation structures 805*a* and 805*b*). In some embodiments, a bottom surface of the well region 803 is higher than a bottom surface of the isolation structures 805*a*, 805*b* and 805*c*.

A dielectric layer 813 is deposited conformally over the semiconductor substrate 801. In some embodiments, the dielectric layer 813 includes silicon oxide, silicon nitride, silicon oxynitride, or multilayers thereof. In some embodiments, the dielectric layer 813 is made of a high-k dielectric material, such as hafnium oxide, lanthanum oxide, aluminum oxide, zirconium oxide, or the like. In addition, the dielectric layer 813 may be deposited by a conformal deposition process, such as a CVD process, an atomic layer deposition (ALD) process, a plasma-enhanced CVD (PECVD) process, another applicable process, or a combination thereof.

A gate electrode 815*a* is formed over the dielectric layer 813 and in an opening between the isolation structure 805*a* and the isolation structure 805*b*. In some embodiments, the gate electrode 815*a* is made of a semiconductor material such as polysilicon. In some embodiments, the gate electrode 815*a* is deposited over the dielectric layer 813 using a CVD process, an ALD process, a sputtering process, or one or more other applicable processes. In some embodiments, top surfaces of the gate electrode 815*a* and the dielectric layer 813 are coplanar to each other.

A resistor electrode 815*b* is formed over the dielectric layer 813 and in an opening above the well region 803. In some embodiments, the resistor electrode 815*b* is made of a semiconductor material such as polysilicon. In some embodiments, the resistor electrode 815*b* is deposited over the dielectric layer 813 using a CVD process, an ALD process, a sputtering process, or one or more other applicable processes.

The gate electrode 815*a* and the resistor electrode 815*b* are formed after ion plantation processes. In some embodiments, a doped concentration of the gate electrode 815*a* is greater than a doped concentration of the resistor electrode 815*b*. In some embodiments, top surfaces of the resistor electrode 815*b* and the dielectric layer 813 are coplanar to each other.

A source/drain (S/D) region 821*a* and an S/D region 821*b* are formed in the semiconductor substrate 801 and on opposite sides of the gate electrode 815*a*. The S/D regions 821*a* and 821*b* may be formed by ion implantation and/or diffusion, and an annealing process, such as a rapid thermal annealing (RTA) process, may be used to activate the implanted dopants. In some embodiments, the S/d region 821*b* is electrically connected to the resistor electrode 815*b*.

In some embodiments, the S/D region 821*a*, the S/D region 821*b*, and the well region 803 are doped with one or more P-type dopants, such as boron (B), gallium (Ga), or indium (In). In alternative embodiments, the S/D region 821*a*, the S/D region 821*b*, and the well region 803 are doped with one or more N-type dopants, such as phosphorous (P) or arsenic (As).

An interlayer dielectric (ILD) layer 823 is formed over the gate electrode 815*a*, the resistor electrode 815*b*, and the dielectric layer 813. In some embodiments, the ILD layer 823 is made of silicon oxide, silicon nitride, silicon oxynitride, phosphosilicate glass (PSG), borophosphosilicate glass (BPSG), low-k dielectric material, and/or other applicable dielectric materials. In addition, the ILD layer 823 may be formed by a CVD process, a physical vapor deposition (PVD) process, an ALD process, a spin-coating process, or another applicable process.

Figure 36:
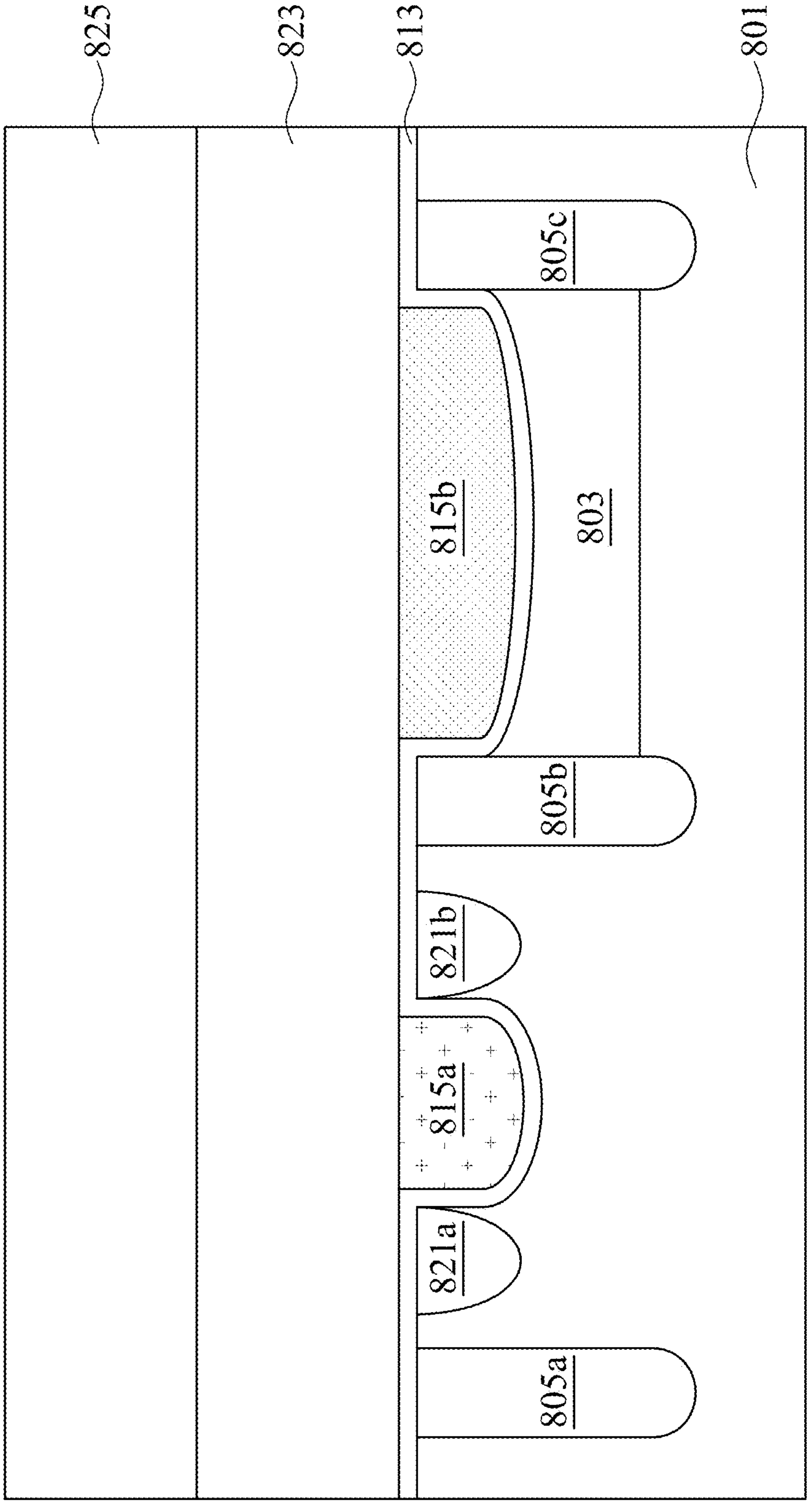

In FIG. 36, a hard mask layer 825 is formed over the structure shown in FIG. 35. In some embodiments, the hard mask layer 825 includes the same materials as the first hard mask layer 201. In some embodiments, the hard mask layer 825 is formed by the same processes as the first hard mask layer 201. In some embodiments, the hard mask layer 825 may be formed of, for example, silicon oxide, silicon nitride, silicon oxynitride, silicon nitride oxide, the like, or a combination thereof. The hard mask layer 825 may be formed by deposition processes such as chemical vapor deposition, plasma enhanced chemical vapor deposition, low pressure chemical vapor deposition, or the like.

Figure 37:
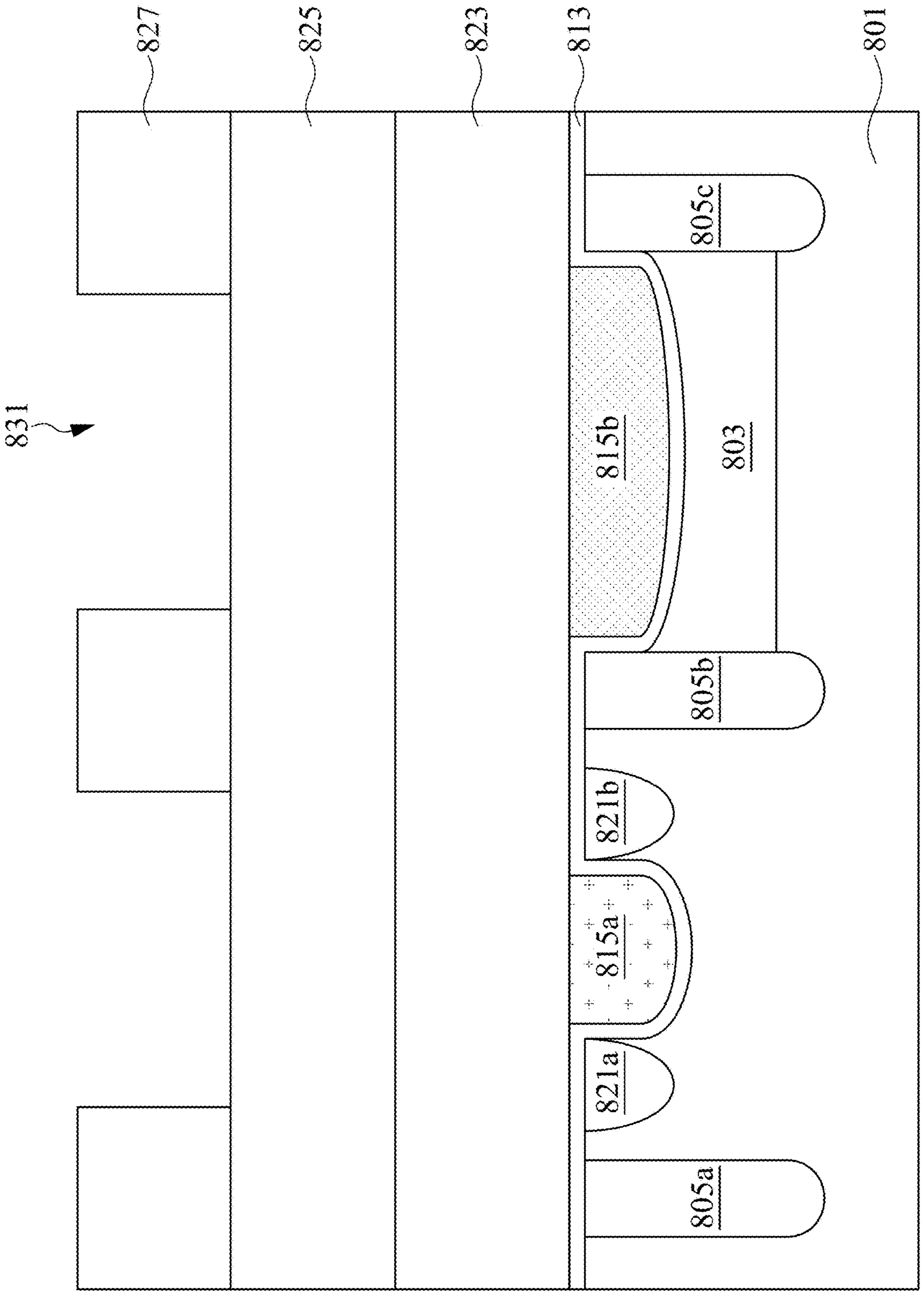

In FIG. 37, a hard mask layer 827 is formed and patterned over the hard mask layer 825. In some embodiments, the hard mask layer 827 includes the same materials as the second hard mask layer 301. In some embodiments, the hard mask layer 827 is formed by the same processes as the second hard mask layer 301. In some embodiments, the hard mask layer 827 may be formed of, for example, silicon oxide, silicon nitride, silicon oxynitride, silicon nitride oxide, the like, or a combination thereof. The hard mask layers 827 may be formed by deposition processes such as chemical vapor deposition, plasma enhanced chemical vapor deposition, low pressure chemical vapor deposition, or the like. Alternatively, in some embodiments, the hard mask layer 827 may be formed of a carbon film. As illustrated in FIG. 37, openings 831 are formed in the hard mask layer 827, and the hard mask layer 825 is exposed by the openings 831.

In FIG. 38, a first tilted etch process 501 may be performed on the hard mask layer 825 to form openings 832 along the hard mask layer 825.

The first tilted etch process 501 may use the hard mask layers 827 as pattern guides to remove portions of the hard mask layer 825 and concurrently form the openings 832 along the hard mask layer 825 and adjacent to a first sides FS1 of the hard mask layers 827. In some embodiments, an angle of incidence θ1 of the first tilted etch process 501 may be define by a width and a height of the opening 831. In some embodiments, the angle of incidence θ1 may be between about 10 degree and about 80 degree. In some embodiments, the angle of incidence θ1 may be between about 20 degree and about 60 degree. In some embodiments, the angle of incidence θ1 may be between about 20 degree and about 40 degree.

In some embodiments, the first tilted etch process 501 may be the same as the first tilted etch process 501 in the method 10.

In FIG. 39, a second tilted etch process 503 may be performed on the hard mask layer 825 to form openings 833 along the hard mask layer 825.

The second tilted etch process 503 may use the hard mask layer 827 as pattern guides to remove portions of the hard mask layer 825 and concurrently form the openings 833 along the hard mask layer 825 and adjacent to second sides SS of the hard mask layers 827. In some embodiments, the angle of incidence θ2 of the second tilted etch process 503 may be define by a width W5 of the opening 831 and a height H2 of the opening 831. In some embodiments, the angle of incidence θ2 of the second tilted etch process 503 may have a same value as the angle of incidence θ1 of the first tilted etch process 501 but the incidence direction of the second tilted etch process 503 may be opposite to the incidence direction of the first tilted etch process 501. In other words, the angle of incidence θ2 of the second tilted etch process 503 may be opposite to the angle of incidence θ1 of the first tilted etch process 501. In such situation, the width W of the openings 833 may be equal to the width W6 of the openings 832. A ratio of the width W6 of the openings 832 to a horizontal distance between one of the openings 832 and an adjacent one of the openings 833 may be between about 1:3 and about 2:3, or may be between 1:2.

In some embodiments, the second tilted etch process 503 may be an anisotropic etch process such as a reactive ion etching process. The process parameters of the second tilted etch process 503 may be the same to the first tilted etch process 501 but only the angles of incidence are different. In some embodiments, the angle of incidence θ2 of the second tilted etch process 503 may be between about −10 degree and about −80 degree. In some embodiments, the angle of incidence θ2 may be between about −20 degree and about −60 degree. In some embodiments, the angle of incidence θ2 may be between about −20 degree and about −40 degree.

In some embodiments, the second tilted etch process 503 may be the same as the second tilted etch process 503 in the method 10.

After the first tilted etch process 501 and the second tilted etch process 503, the hard mask layer 825 may be patterned to a patterned hard mask layer 825' by the openings 832 and the openings 833.

In FIG. 40, a hard mask etch process may be performed to remove the hard mask layers 827. In some embodiments, an etch rate ratio of the hard mask layers 827 to the patterned hard mask layer 825' may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the hard mask etch process.

After removing the hard mask layers 827, the ILD layer 823 is patterned using the patterned hard mask layer 825' as a mask. A target layer etch process may be performed to remove portions of the ILD layer 823. After the target layer etch process, the ILD layer 823 may be turned into a patterned ILD layer 823'. In some embodiments, an etch rate ratio of the ILD layer 823 to the patterned hard mask layer 825' may be between about 100:1 and about 1.05:1, between about 100:1 and about 10:1, between about 50:1 and about 10:1, between about 30:1 and about 10:1, between about 20:1 and about 10:1, or between about 15:1 and about 10:1 during the target layer etch process. The semiconductor device 2A is generated after the patterned hard mask layer 825' is removed.

In some embodiments, the elements between the isolation structures 805*a* and 805*b* are configured to be a transistor, and the elements between the isolation structures 805*b* and 805*c* are configured to be a resistor.

Figure 41:
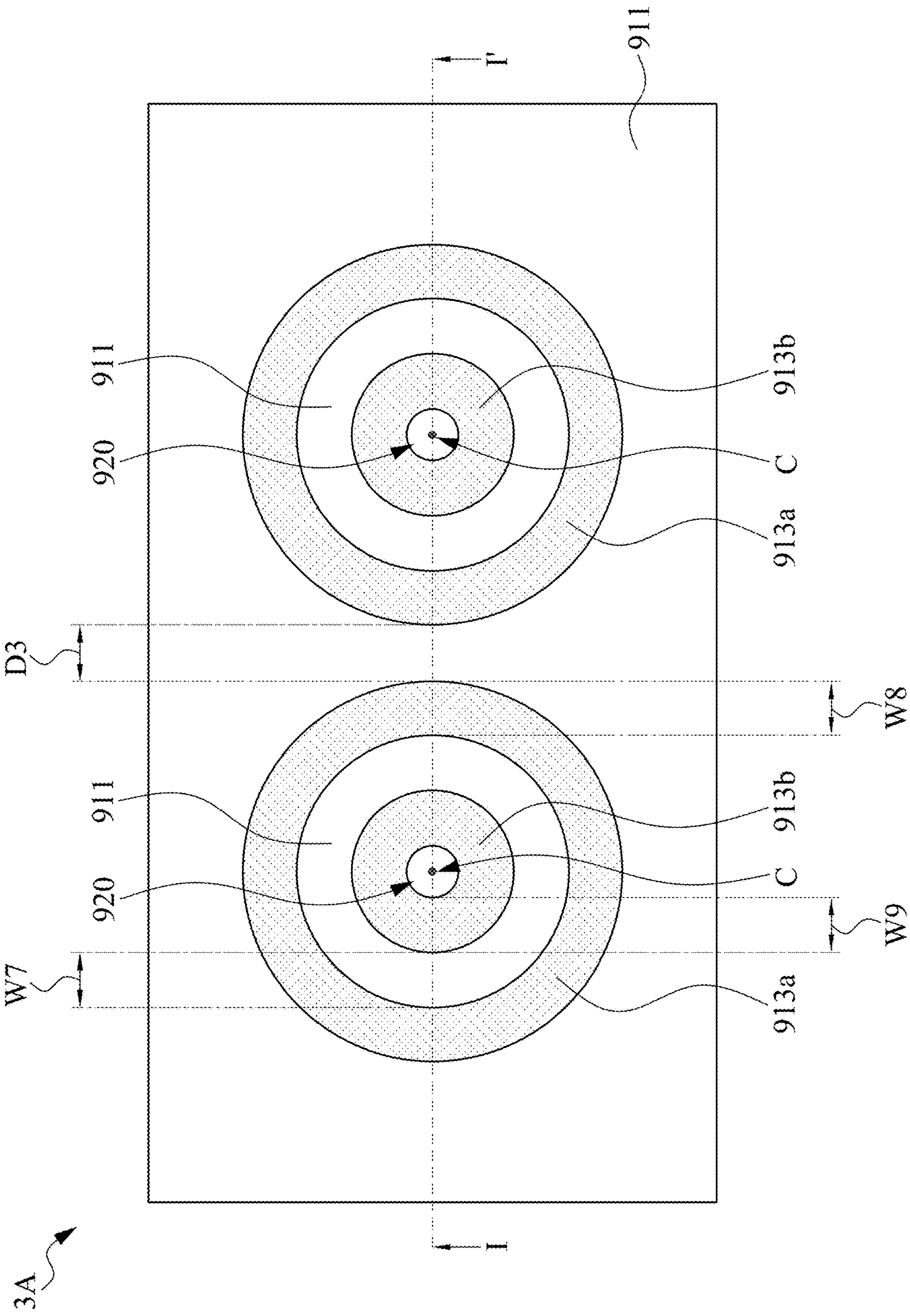
FIG. 41 is a top view illustrating a semiconductor structure, in accordance with some embodiments of the present disclosure.
Figure 42:
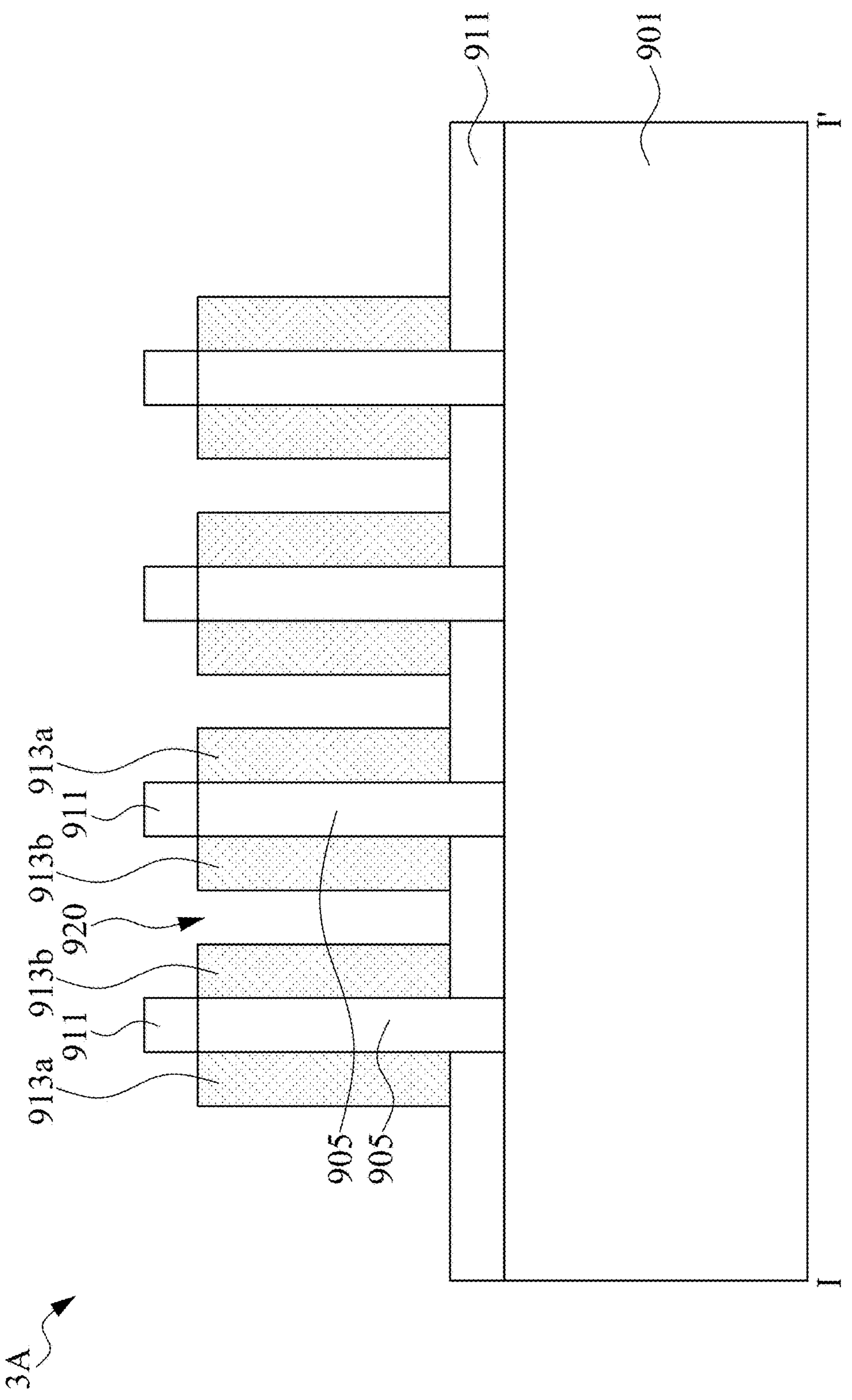
FIG. 42 is a cross-sectional view illustrating the semiconductor structure along a section line shown in FIG. 41, in accordance with some embodiments of the present disclosure.

Reference is made to FIG. 41 and FIG. 42. FIG. 41 is a top view illustrating a semiconductor structure 3A, in accordance with some embodiments of the present disclosure. FIG. 42 is a cross-sectional view illustrating the semiconductor structure 3A along a section line I-I' of FIG. 41, in accordance with some embodiments of the present disclosure.

In some embodiments, the first etch process 501 shown in FIG. 33 to FIG. 34 can be applied to fabricate the semiconductor structure 3A.

In FIG. 41 and FIG. 42, a semiconductor substrate 901 is provided. In some embodiments, the semiconductor substrate 901 is made of silicon. Alternatively, the semiconductor substrate 901 may include other elementary semiconductor materials such as germanium (Ge). In some embodiments, the semiconductor substrate 901 is made of a compound semiconductor such as silicon carbide, gallium nitride, gallium arsenic, indium arsenide, or indium phosphide. In some embodiments, the semiconductor substrate 901 is made of an alloy semiconductor such as silicon germanium, silicon germanium carbide, gallium arsenic phosphide, or gallium indium phosphide. In some embodiments, the semiconductor substrate 901 includes a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or by other suitable methods. In some embodiments, the semiconductor substrate 901 includes various material layers (e.g., dielectric layers, semiconductor layers, and/or conductive layers) configured to form integrated circuit (IC) features (e.g., doped regions/features, isolation features, gate features, source/drain features (including epitaxial source/drain features), interconnect features, other features, or combinations thereof).

Ring structures 905 are formed on the semiconductor substrate 901. Each of the ring structures 905 has a center C from the top view. The ring structure 905 has a width W7. Two ring structures 905 are separated by a distance D3. In some embodiments, the width W7 is equal to the distance D3. In some embodiments, the ring structures 905 includes silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof.

A dielectric layer 911 is formed over the top surface of the ring structures 905 and the exposed top surface of the semiconductor substrate 901.

Ring structures 913*a* are formed over external sidewalls of the ring structures 905, and ring structures 913*b* are formed over internal sidewalls of the ring structures 905. In other words, each of the ring structures 905 is sandwiched between and in direct contact with the ring structure 913*a* and the ring structure 913*b*. In some embodiments, a width W8 of the ring structure 913*a* is substantially equal to the width W7. In some embodiments, a width W9 of the ring structure 913*b* is substantially equal to the width W7. In some embodiments, an inner diameter of the third ring structures 913*b* is substantially equal to the width W7.

The ring structures 913*a* and 913*b* includes silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof. It should be noted that the materials of the ring structures 913*a* and 913*b* are different from the material of the ring structures 905.

Openings 920 are formed. In FIG. 42, portions of dielectric layer 911 are exposed by the openings 920.

In some embodiments, the openings 920 are formed by performing the first etch process 501 with a 360 degree rotation. More specifically, the ring structures 913*b* are originally cylinder structures which fill the inner space of the ring structures 905, and the first etch process 501 is performed to remove a central portion of the cylinder structures to form the openings 920. A patterned hard mask is formed over the ring structures 913*a* and the dielectric layer 913, and the first etch process 501 is performed to etch the cylinder structures according to the patterned hard mask. When the first etch process 501 is performed, the semiconductor substrate 901 is rotated 360 degree. After the ring structures 913*b* are formed, the patterned hard mask is removed, and the semiconductor structure 3A is obtained. Based on the benefit brought by the first etch process 501 with the 360 degree rotation, the diameter of the ring structures 913*b* can be reduced.

One aspect of the present disclosure provides a semiconductor device including a first isolation structure, a second isolation structure, and a third isolation structure disposed in a semiconductor substrate. The semiconductor device further includes a transistor and a resistor. The transistor is disposed between the first isolation structure and the second isolation structure, and includes a gate electrode and a first source/drain (S/D) region. The resistor is disposed between the second isolation structure and the third isolation structure, and includes a resistor electrode. The first S/D region is disposed between the gate electrode and the second isolation structure, and is electrically connected to the resistor electrode.

Another aspect of the present disclosure provides a method for fabricating a semiconductor device. The method includes: providing a semiconductor substrate; forming a first isolation structure, a second isolation structure, and a third isolation structure in the semiconductor substrate; forming a transistor between the first isolation structure and the second isolation structure; forming a resistor between the second isolation and the third isolation structure; and performing a first tilted etch process and a second tilted etch process to form a patterned interlayer dielectric (ILD) layer over the transistor and the resistor.

Another aspect of the present disclosure provides a method for fabricating a semiconductor structure. The method includes: providing a semiconductor substrate; forming a first ring structure on the semiconductor substrate; forming a dielectric layer over the semiconductor substrate; forming a second ring structure over an external sidewall of the first ring structure; and forming a third ring structure over an internal sidewall of the first ring structure. Forming a third ring structure over an internal sidewall of the first ring structure includes: forming a cylinder structure to fill the first ring structure; and performing a tilted etch process to remove a central portion of the cylinder structure to form the third ring structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semi-product of a semiconductor device, comprising:
- a first isolation structure, a second isolation structure, and a third isolation structure disposed in a semiconductor substrate;
- a transistor, disposed between the first isolation structure and the second isolation structure, comprising a gate electrode and a first source/drain (S/D) region;
- a resistor, disposed between the second isolation structure and the third isolation structure, comprising a resistor electrode;
- an interlayer dielectric (ILD) layer, disposed over the semiconductor substrate;
- a first hard mask layer disposed on and in contact with the ILD layer, wherein the first hard mask layer has a first opening, a second opening, a third opening, and a fourth opening formed therethrough; and
- a second hard mask layer disposed on and in contact with the first hard mask layer, wherein the second hard mask layer has a fifth opening and a sixth opening formed therethrough,
- wherein the first opening and the second opening are respectively connected the fifth opening along two sidewalls of the fifth opening, and extend from the fifth opening to the ILD layer, wherein the first opening and the second opening are aligned with the transistor from a top view perspective;
- wherein the third opening and the fourth opening are respectively connected to the sixth opening along two sidewalls of the sixth opening, and extend from the sixth opening to the ILD layer, wherein the third opening and the fourth opening are aligned with the resistor electrode from the top view perspective;
- wherein the first S/D region is disposed between the gate electrode and the second isolation structure, and is electrically connected to the resistor electrode;
- wherein widths of the first opening, the second opening, the third opening, and the fourth opening are equal, wherein a width of each of the fifth opening and the sixth opening is larger than a width of each of the first opening, the second opening, the third opening, and the fourth opening.

2. The semi-product of the semiconductor device of claim 1, wherein the transistor further comprises:
- a second S/D region disposed between the first isolation structure and the gate electrode;
- wherein the first opening and the second opening are respectively aligned with the first S/D region and the second S/D region of the transistor from the top view perspective;
- wherein a distance between the two sidewalls of the sixth opening is less than a width of the resistor electrode and is equal to a distance between the third opening and the fourth opening;
- wherein a distance between the two sidewalls of the fifth opening is less than a distance between the first S/D region and the second S/D region and is equal to a distance between the first opening and the second opening.

3. The semi-product of the semiconductor device of claim 2, wherein the transistor further comprises:
- a first dielectric layer in contact with the first S/D region, the second S/D region, and the gate electrode,
- wherein the gate electrode is separated from the first S/D region and the second S/D region by the first dielectric layer.

4. The semi-product of the semiconductor device of claim 3,
- wherein the ILD layer is in contact with the first dielectric layer and the gate electrode.

5. The semi-product of the semiconductor device of claim 4, wherein the first S/D region and the second S/D region are exposed by the ILD layer.

6. The semi-product of the semiconductor device of claim 4, wherein the resistor further comprises:
- a well region, disposed below the resistor electrode; and
- a second dielectric layer in contact with the resistor electrode and the well region, wherein the well region is separated from the resistor electrode by the second dielectric layer.

7. The semi-product of the semiconductor device of claim 6, wherein the second dielectric layer is extended to a top surface of the first isolation structure and a top surface of the first S/D region.

8. The semi-product of the semiconductor device of claim 6, wherein a bottom surface of the well region is higher than a bottom surface of the second isolation structure and a bottom surface of the third isolation structure.

9. The semi-product of the semiconductor device of claim 6, wherein the ILD layer is further in contact with the second dielectric layer and the resistor electrode.

10. The semi-product of the semiconductor device of claim 9, wherein a portion of the resistor electrode is exposed by the ILD layer.

* * * * *